(12) United States Patent
Kamiyama et al.

(10) Patent No.: US 6,271,852 B1
(45) Date of Patent: Aug. 7, 2001

(54) BOUNDARY PROCESSING OF OBLIQUE OVERLAPPING GRAPHICS TO ACHIEVE DIMENSIONALLY ACCURATE ELECTRON BEAM IRRADIATION

(75) Inventors: Kinya Kamiyama; Koichi Moriizumi; Hironobu Taoka, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/856,706

(22) Filed: May 15, 1997

(30) Foreign Application Priority Data

Nov. 22, 1996 (JP) .................................................... 8-312269

(51) Int. Cl.⁷ .................................................... G06T 11/00
(52) U.S. Cl. ...................... 345/423; 345/435; 250/492.22
(58) Field of Search ...................... 345/434, 435, 345/423, 433, 436, 438; 250/492.22

(56) References Cited

U.S. PATENT DOCUMENTS

| | | | |
|---|---|---|---|
| 4,181,860 | * | 1/1980 | Sumi ..................................... 250/492 |
| 4,433,384 | * | 2/1984 | Berrian et al. ........................ 364/525 |
| 4,482,810 | * | 11/1984 | Cooke ................................ 250/492.2 |
| 4,816,692 | | 3/1989 | Rudert, Jr. . |
| 5,189,306 | | 2/1993 | Frei . |
| 5,309,354 | * | 5/1994 | Dick ................................. 364/167.01 |
| 5,526,279 | * | 6/1996 | Dick ....................................... 364/491 |
| 5,621,216 | * | 4/1997 | Clarke et al. ..................... 250/492.22 |

FOREIGN PATENT DOCUMENTS

| | | |
|---|---|---|
| 61-230321 | 10/1986 | (JP) . |
| 62-41417 | 9/1987 | (JP) . |
| 64-25415 | 1/1989 | (JP) . |
| 5-114008 | 5/1993 | (JP) . |
| 5-267142 | 10/1993 | (JP) . |

* cited by examiner

*Primary Examiner*—Cliff N. Vo
(74) *Attorney, Agent, or Firm*—McDermott, Will & Emery

(57) ABSTRACT

A electron beam writing data creating device comprises a redundant part split means for splitting data into a redundant part formed by connecting redundant areas of graphic data processing areas with each other and an internal area defined in the graphic data processing area by the outer periphery of the redundant area. The redundant part split means splits design layout data into the redundant part and the internal area, for independently performing overlap removal processing in each area. Thus, a electron beam writing data creating device capable of effectively suppressing deterioration of dimensional accuracy of a writing pattern can be provided.

10 Claims, 32 Drawing Sheets

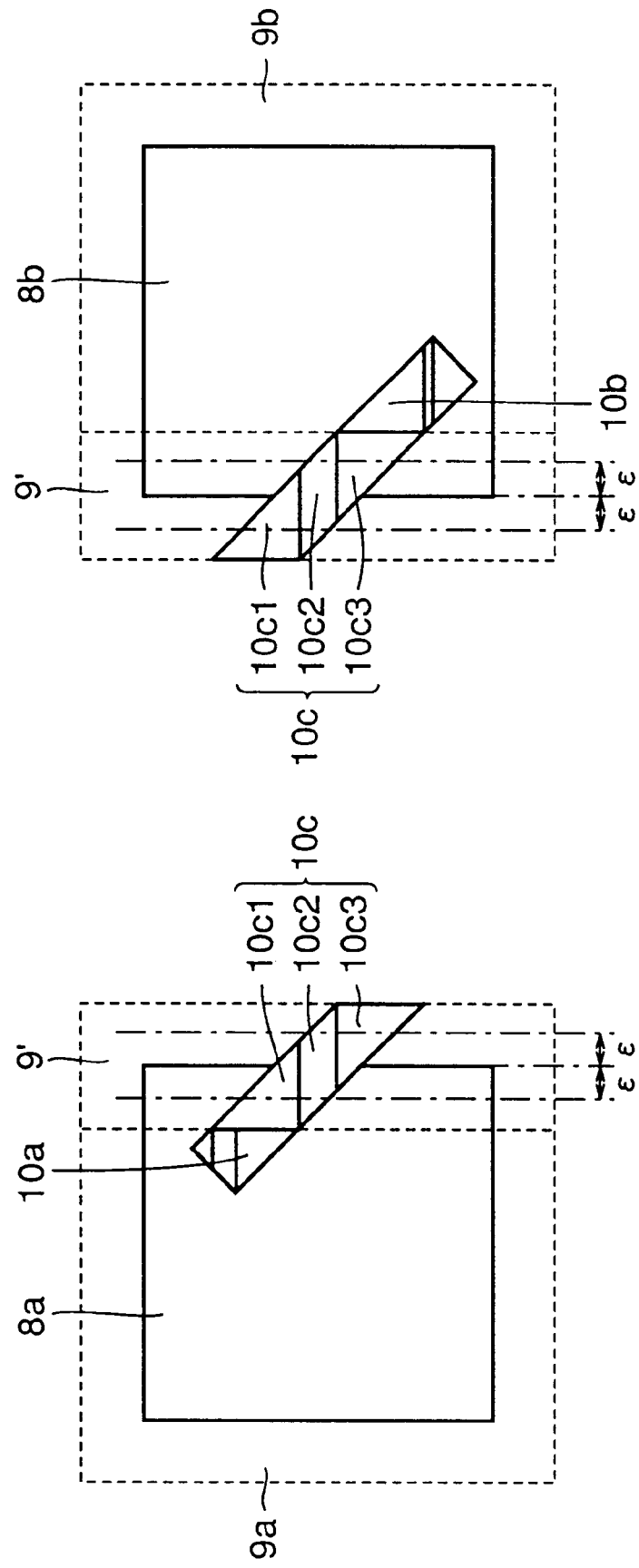

FIG.12A
FIG.12B
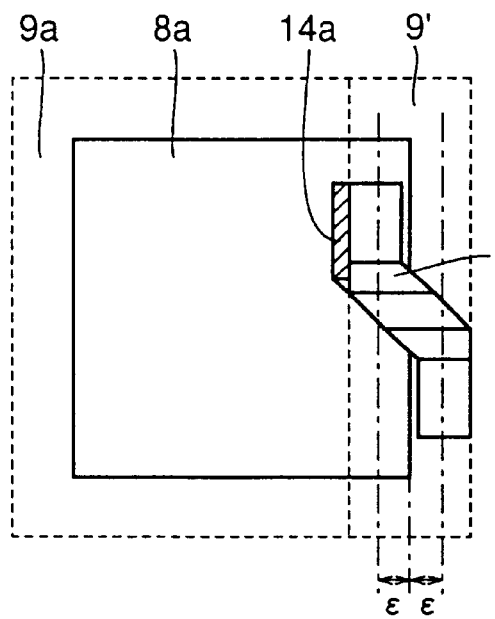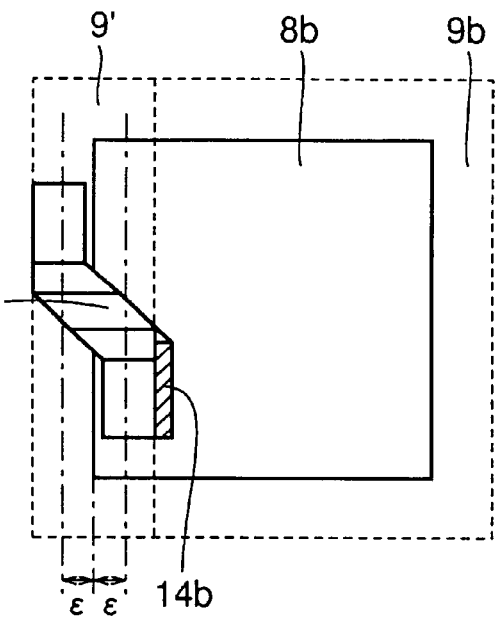
FIG.13A
FIG.13B
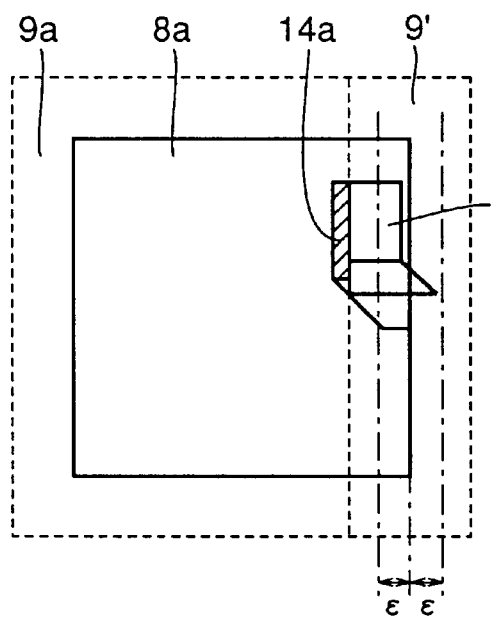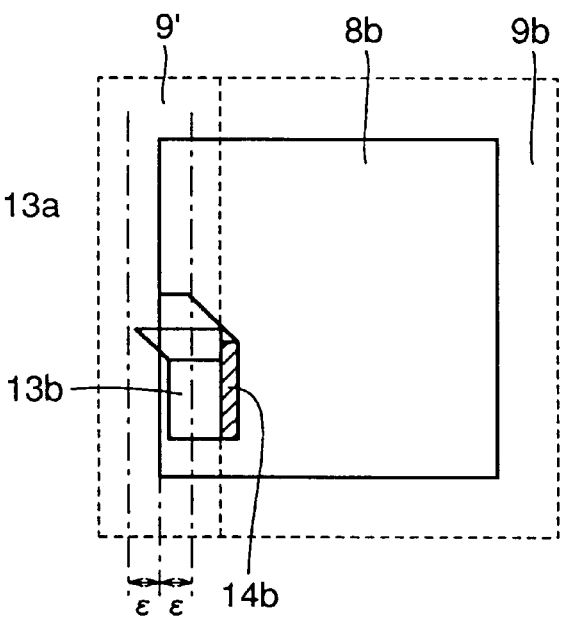

FIG.14A
FIG.14B
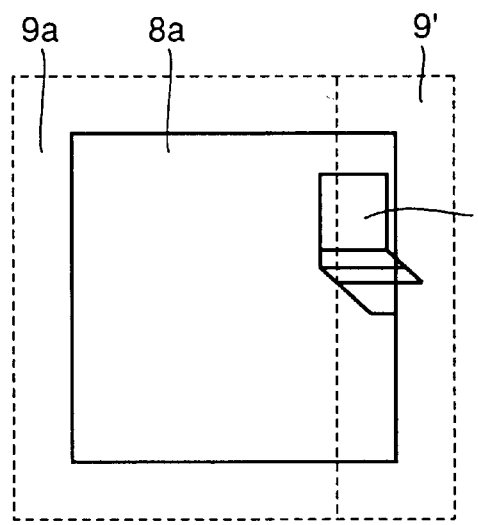
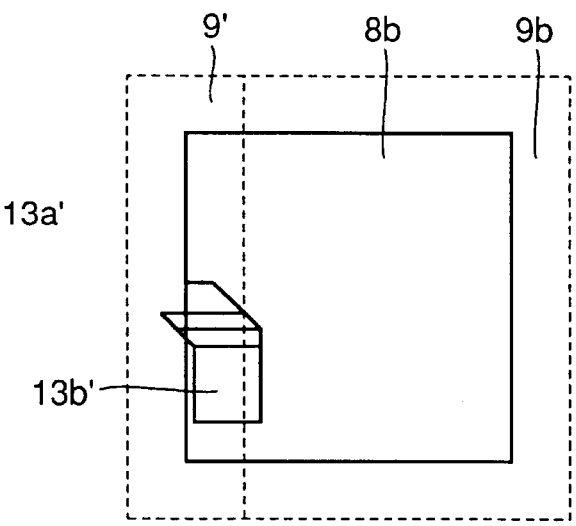
FIG.15
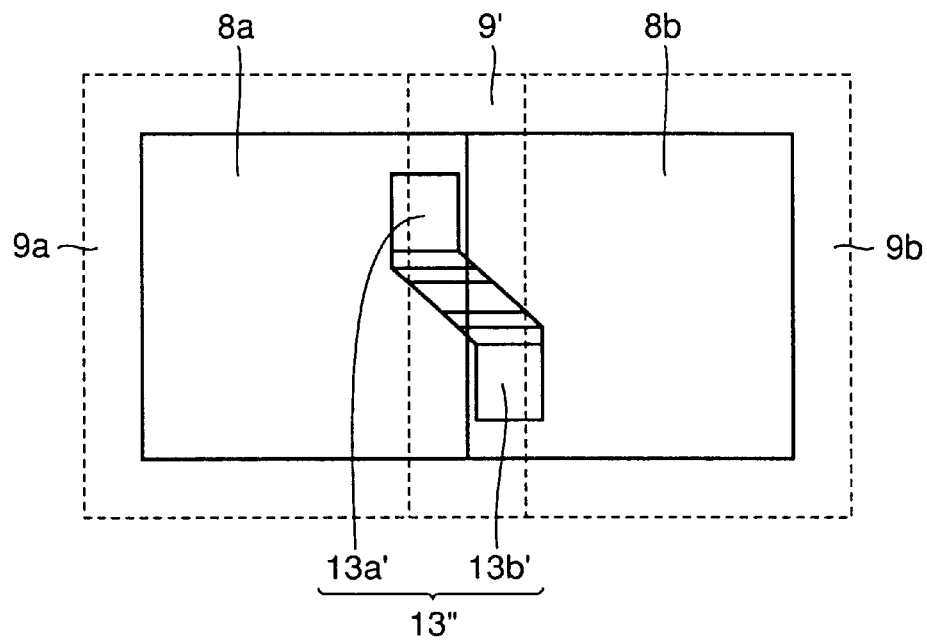

FIG.51 PRIOR ART
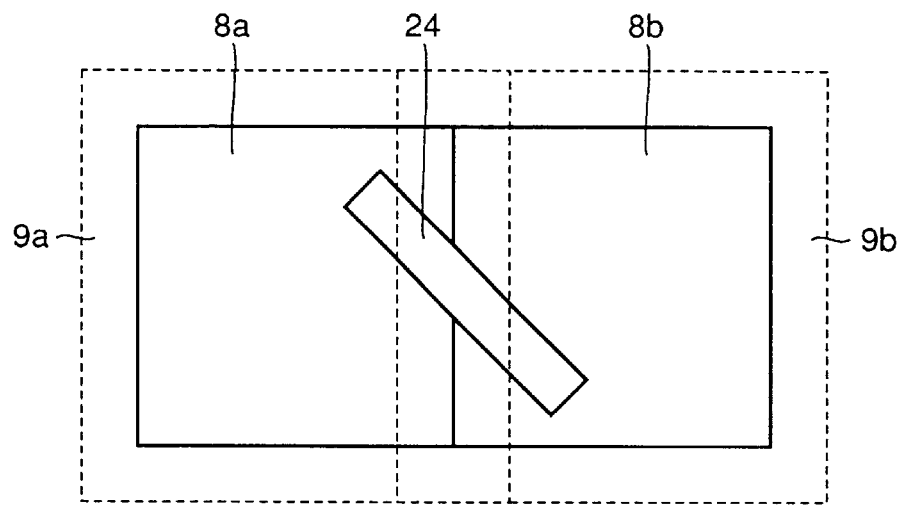
FIG.52A PRIOR ART
FIG.52B PRIOR ART
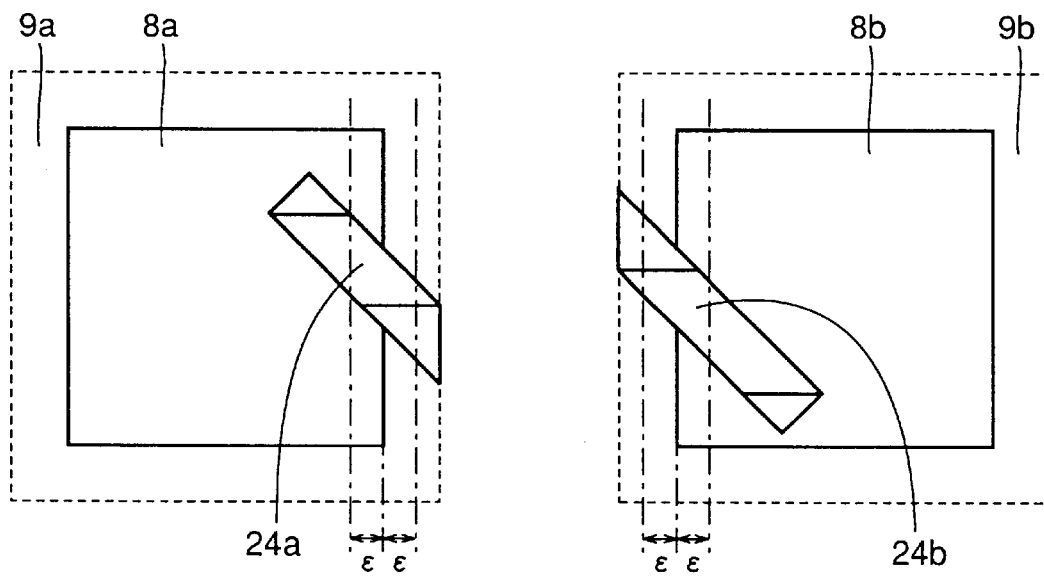

BOUNDARY PROCESSING OF OBLIQUE OVERLAPPING GRAPHICS TO ACHIEVE DIMENSIONALLY ACCURATE ELECTRON BEAM IRRADIATION

BACKGROUND OF THE INVENTION

1. Field of the Invention

The present invention relates to a electron beam writing data creating device which can remarkably reduce generation of small graphic data causing deterioration of dimensional accuracy.

2. Description of the Background Art

Due to high fine workability and high controllability, electron beam writing is widely employed for preparing masks which are employed for fabricating semiconductor devices, particularly large-scale integrated circuits (LSIs). Electron beam writing systems can be classified into raster scan and vector scan systems. The raster scan system, which is widely employed for preparing masks in general due to simple device structures and easiness in creation of writing data, has such a disadvantage that the writing speed significantly depends on the minimum grid size (address unit size) for specifying the sizes of the written graphics and the writing positions. In practice, it may be impossible to write graphics in preparation of masks for a 64-Mbit dynamic random access memory (DRAM) or the like requiring small address units by the raster scan system, due to excessively long writing times.

A variable shaping system, which is one of vector scan systems, is recently watched with interest. The variable shaping writing system is adapted to shape an electron beam in correspondence to the sizes of written graphics for irradiating only necessary areas with the electron beam. Thus, the writing speed is increased, and the address unit size can be reduced. Thus, it is considered that the variable shaping system forms the mainstream of electron beam direct writing employed for preparing masks for devices following the 64-M DRAM and development of devices following the 1-G DRAM.

While the variable shaping writing system has the aforementioned characteristics, the processing for creating writing data in this system is disadvantageously complicated and requires a long processing time as compared with the raster scan system. The procedure of creating writing data employed for the variable shaping writing system and the writing procedure are now described.

FIG. 20 illustrates a part of design pattern data 20 for an LSI, which is generally expressed as a polygon (enumeration of vertex coordinates). In order to write the pattern data 20 by a variable shaping electron beam writing system, it is necessary to split the same into basic graphics such as rectangles, squares, triangles and/or trapezoids (hereinafter simply referred to as "trapezoids"). FIGS. 21 and 22 illustrate the pattern data 20 split into trapezoids by horizontally and vertically inserting split lines from vertices of the pattern data 20 respectively.

First, the procedure of actually writing a graphic with the pattern data 20 shown in FIG. 21 is described. When the pattern data of an area 20a shown in FIG. 21 is inputted in an electron beam writing system, an electron beam shaping deflector forms an electron beam having a width Ws1 and a height Hs1.

Then, an electron beam irradiation position specifying deflector moves the beam to an irradiation position (x1, y1), for irradiating a resist film which is applied onto a sample such as a mask substrate or a silicon wafer with the electron beam by a time corresponding to an exposure necessary for photosensitizing the resist film. Then, the pattern data corresponding to an area 20b in FIG. 21 is inputted in the electron beam writing system, which in turn executes electron beam writing system in a similar manner to the above. This processing is successively repeated as to all patterns of the LSI, thereby writing all patterns of the LSI.

Problems in creation of writing data through the aforementioned variable shaping writing system are now described. FIG. 23 shows a resist pattern 21 which is formed on a mask by converting the pattern data 20 shown in FIG. 20 to writing data, writing the pattern on the mask with the writing data, and developing a resist film. Note the pattern dimensional accuracy in a portion of this resist pattern 21 having a width Wm, and consider the factor deteriorating the accuracy. No factor related to pattern formation process conditions such as resist development are taken into consideration here.

When the pattern data 20 shown in FIG. 20 is split along the horizontal split line as shown in FIG. 21, the dimension of the width Wm is influenced only by shaping accuracy of the electron beam which is shaped in response to the graphic of the area 20a shown in FIG. 21, i.e., the dimensional accuracy of the electron beam in the portion corresponding to the width Ws1.

When the pattern data 20 is split along the vertical split line as shown in FIG. 22, however, the dimension of the width Wm is influenced by irradiation positional accuracy of electron beams corresponding to areas 20c and 20d shown in FIG. 22 and the shaping accuracy. Thus, two factors additionally influence the resist pattern dimensional accuracy, as compared with the case of splitting the pattern data 20 along the horizontal split line shown in FIG. 21.

FIGS. 24 and 25 show results obtained by forming a plurality of resist patterns with writing data prepared by different split methods shown in FIGS. 21 and 22 and measuring the dimensions thereof respectively. FIG. 24 shows the result in case of employing the writing data shown in FIG. 21 for forming the resist pattern of the portion having the width Wm by one-shot electron beam irradiation. FIG. 25 shows the result in case of employing the writing data shown in FIG. 22 for forming the resist pattern of the portion having the width Wm by two-shot electron beam irradiation in different positions.

As shown in FIGS. 24 and 25, the dimensional dispersion is about ±0.025 $\mu$m in case of forming the resist pattern by one-shot electron beam irradiation, while that in case of forming the pattern by two-shot electron beam irradiation is about ±0.075 $\mu$m. Namely, it is understood that the dispersion of the pattern dimensions, i.e., the dimensional accuracy is deteriorated by the two-shot electron beam irradiation. This is one of the problems in the variable shaping writing data creation.

When a resist pattern is formed by irradiation with an electron beam of two or more shots on different positions and an edge of the resist pattern is formed with a small-sized shot among the plurality of shots, the dimensional accuracy of the formed resist pattern is further deteriorated. This problem is described with reference to FIGS. 26A, 26B, 27A and 27B.

A graph shown in FIG. 26B illustrates the intensity distribution of an electron beam which is shaped as shown in FIG. 26A. The intensity distribution of this electron beam is not completely rectangular, but spread on edge portions. The slopes (hereinafter referred to as "beam sharpness") of the intensity distribution at the edges vary with the size of the shaped beam. In general, Coulomb repulsion in the electron beam is increased as the size of the shaped beam is increased, leading to reduction of the beam sharpness and dulling of the intensity distribution on the edges.

On the other hand, FIG. 27B illustrates intensity distribution of an electron beam of two shots shown in FIG. 27A for forming a pattern of the same size as that shown in FIG. 26A with a small-sized left shot. As shown in FIGS. 27A and 27B, the intensity distribution on the left edge is different from that shown in FIG. 26B, leading to difference between the dimensions of the formed resist patterns.

FIG. 28 shows a result obtained by forming a plurality of resist patterns with two-shot electron beam irradiation including a small graphic as shown in FIGS. 27A and 27B and measuring resist dimensions. As compared with the result (FIG. 24) in case of writing the graphic with one-shot beam irradiation, dimensional dispersion is increased while difference results in the average value. This difference of the average value results from the electron beam irradiation of the small graphic.

The size of such a small graphic exhibiting remarkable deterioration of the dimensional accuracy extremely depends on the employed electron beam writing system, the type of the resist material, the pattern formation process method and the conditions, while the length of a side defining either the width or the height of the graphic data is not more than 0.5 µm, in general.

A writing data processing flow of the conventional variable shaping electron beam writing system is now described. FIG. 29 is a block diagram schematically showing the structure of a conventional electron beam writing data creating device 1.

Referring to FIG. 29, a graphic data processing area split means 2 first splits design layout data inputted in the electron beam writing data creating device 1 into graphic data processing area units of arbitrary dimensions. This operation is adapted to split a chip area of an LSI including enormous graphic data into graphic data processing areas thereby reducing the number of simultaneously processed graphic data and speeding up the processing, while processing the data within the limit of the processing capacity in the system structure (particularly that of a memory area) of the writing data creating device 1. In the graphic data processing area split processing, redundant areas are provided not to cut graphics extending across boundaries between the graphic data processing areas on the boundaries. Namely, areas including the redundant areas define the graphic data processing areas at this point of time. This processing is necessary for splitting the graphic data not to generate small graphics on the boundaries between the graphic data processing areas. The spaces between the boundaries of the redundant areas and the graphic data processing areas may have values sufficiently larger than the sizes of the intended small graphics.

Then, an overlap removal/tone reversal means 4 of the writing data creating device 1 removes overlap between the graphics. This processing, which is adapted to prevent double electron beam irradiation, is requisite for writing data creation of the variable shaping electron beam writing system. In case of irradiating a portion other than the areas inputted in design with the electron beam, tone reversal processing is necessary for generating a graphic in an area having no graphic. Overlap of graphics is removed from portions other than the redundant areas at this point of time. While various methods may be employed for the aforementioned overlap removal and tone reversal processing, a slab method is generally employed. Overlap removal processing employing the slab method is described with reference to FIGS. 30A and 30B.

Referring to FIG. 30A, split lines are formed on the overall surface of the processed area to extend from respective vertices of respective graphics in a fixed direction (horizontal or vertical direction), for splitting the processed area into long rectangular areas (slabs). Then, the graphics are split along the boundaries between the slabs. Referring to FIG. 30A, the processed area is horizontally split.

Then, the sides of the split graphics are directed, thereby defining vectors. The manner of directing is decided depending on whether the vertices are traced clockwise or anticlockwise along the sides. Then, values (hereinafter referred to as "vector direction values") indicating the directions of the vectors in the slabs are provided to the respective vectors. When the slabs are horizontally formed as shown in FIG. 30A, for example, each vector directed from the lower side to the upper side of the vector is provided with a value 1, and that directed from the upper side to the lower side is provided with a value −1. FIG. 30A shows this state in a slab 5. In this case, the vertices of the graphics are traced clockwise.

A method of deleting a portion having overlapping graphics is now described. First, all vectors included in each slab are sorted with coordinate values of contact points between the vectors and the lower side of the slab. Then, the vector direction values provided to the vectors are successively accumulated from the left side when the slab is horizontally formed, for searching for a vector bringing an accumulation result "0" of the vector direction values. A basic graphic is formed by the vector for starting the addition and that bringing the accumulation result "0" . This processing is described with reference to the slab 5 shown in FIG. 30A. The accumulation is started from the vector on the left end, such that the accumulation result of the vector direction values is 2 on the second vector, 1 on the third vector and zero on the fourth vector. Thus, a graphic is formed by the leftmost and fourth vectors in the slab 5, while the second and third vectors are deleted as unnecessary vectors. FIG. 30B shows the result of the processing. The aforementioned processing is performed on the vectors in all slabs, thereby removing overlap of all graphics. It is understood that all data are split into basic graphics as a result of the processing through this method. This method is suitable for processing a large quantity of graphic data, due to a high processing speed.

Then, a redundant part removal means 5 splits graphics included in the redundant areas of the graphic data processing areas not to generate small graphics on the boundaries between the graphic data processing areas, thereby removing overlap of graphics on the redundant areas. Thus, overlap of graphics is removed in all LSI chip areas.

In addition to the aforementioned functions, the writing data creating device 1 comprises a writing field boundary split means 6 having a function of splitting the processed area to areas (hereinafter referred to as "writing field areas") on which the electron beam writing system can write graphics only by deflection of an electron beam, a data formatting means 7 for formatting the data in a data structure which can be inputted in a desired writing system, and the like. In the variable shaping electron beam writing system referred to this time, the sizes of the writing field areas can be set at arbitrary values of not more than 2.5 mm in general.

However, the aforementioned conventional electron beam writing data creating device 1 has the following problems, which are now described with reference to FIGS. 31 to 55:

First, redundant part removal processing is described with reference to FIG. 31. FIG. 31 is a flow chart of the redundant part removal processing. Small graphic dimensions are defined as input parameters, and positional relations between boundaries of graphic data processing areas and graphic data are compared with each other as to graphic data in graphic data processing areas including redundant areas. The aforementioned flow chart is now described with reference to examples shown in FIGS. 32A to 49.

Referring to FIGS. 32A to 32C, a solid line area defined by W1 and W2 is a graphic data processing area 8, broken lines show a boundary of a redundant area 9, and an area defined by P1 and P2 is a graphic data area (hereinafter referred to as "graphic area") 22. The graphic area is defined as a rectangular area which is circumscribed with graphic data. Rectangular graphic data matches with a graphic area, while an area 22' shown in FIG. 33 defines a graphic area in case of trapezoidal graphic data.

As shown in FIG. 31, the aforementioned small graphic dimensions and basic graphic data are inputted (steps S1 and S2), the graphic data processing area 8 is read (step S3), the graphic data are sequentially read (step S4), positional relations between the graphic data processing area boundary (left, right, lower and upper sides) and the graphic area 22 are compared with each other (steps S5 to S8), and boundary processing is performed when the graphic area 22 extends across any graphic data processing area boundary (steps S10 to S17). This boundary processing is described later in detail.

The graphic data is not outputted when the graphic area 22 is present between the boundary of the redundant area 9 and the graphic data processing area 8 as shown in FIG. 32B, while the graphic data is outputted as such when the graphic area 22 is present in the graphic data processing area 8 as shown in FIG. 32C (step S9).

The boundary processing is now described. Each graphic data processing area 8 has the redundant area 9, and adjacent graphic data processing areas 8 to hold a graphic data group in the redundant area 9. Therefore, overlap removal processing can be independently performed on the graphic data in the redundant area 9 for every graphic data processing area 8 without generating small graphics by deciding a certain procedure.

An outline of the aforementioned boundary processing is now described with reference to FIGS. 34 to 49. FIG. 35 is a flow chart of the boundary processing on the graphic area 22 extending across the left side of the graphic data processing area 8. Referring to FIG. 35, symbol ε represents an inputted small graphic dimensional value, and the remaining symbols in this flow chart correspond to those in FIG. 34.

In this boundary processing, four types of graphic areas 22a, 22b, 22c and 22d in total shown in FIG. 36 are processed. FIG. 37 shows a result of the boundary processing in FIG. 36. Referring to FIG. 36, the width of graphic data on a left portion is smaller than the small graphic dimensional value ε in the graphic area 22a, in case of splitting the graphic data along a graphic data processing area boundary. In the graphic area 22b, the width of graphic data on a right portion which is split similarly to the graphic area 22a is smaller than the small graphic dimensional value ε. In the graphic area 22c, both of widths of graphic data split similarly to the graphic area 22a are larger than the small graphic dimensional value ε. In the graphic area 22d, both of widths of graphic data split similarly to the graphic area 22a are smaller than the small graphic dimensional value ε.

In processing which is common to all sides of the graphic data processing area boundary, no small graphic is generated following splitting along the graphic data processing area boundary (the graphic area 22c shown in FIG. 36). In this case, the graphic is split along the graphic data processing area boundary (steps S1 to S3 in FIG. 35), for outputting only graphic data (graphic area 22c' in FIG. 37) remaining in the graphic data processing area 8, as shown in FIG. 37 (step S4 in FIG. 35). If either one of graphics split on the graphic data processing area 8 is a small graphic (the graphic area 22a or 22b in FIG. 36) and the graphic in the graphic data processing area 8 is small (the graphic area 22b in FIG. 36), the graphics are not outputted, as shown in FIG. 37 (step S1 in FIG. 35). When a graphic outside the graphic data processing area 8 is small (the graphic area 22a in FIG. 36), this graphic area is not split along the graphic data processing area boundary but outputted as such, as shown in FIG. 37 (steps S1, S2 and S4 in FIG. 35). If both of the split graphics are small inside and outside the graphic data processing area 8, as in the graphic area 22d in FIG. 36, this graphic area 22d is not split. In this case, outputted sides are decided. Namely, a graphic such as the aforementioned graphic area 22d is outputted on the right and upper sides of the graphic data processing area boundary, and not outputted on the left and lower sides.

The aforementioned processing is performed on the right, upper and lower sides of the graphic data processing area 8 respectively. FIGS. 38 to 41 show the processing on the right side of the graphic data processing area 8, FIGS. 42 to 45 show that on the upper side of the graphic data processing area 8, and FIGS. 46 to 49 show that on the lower side of the graphic data processing area 8 respectively. Each processing is similar to that on the left side, and hence redundant description is omitted.

The aforementioned boundary processing is performed on the premise that both of graphics in the redundant area 9 are identical to each other in the adjacent graphic data processing areas 8. If graphic data including oblique lines is inputted, however, different split lines enter graphic data in each redundant area 9 in each graphic data processing area 8 although contours of the graphic data in the redundant area 9 appear identical to each other in adjacent graphic data processing areas 8, and hence the graphic data may not be grasped as that of a common graphic by the adjacent graphic data processing area 8, leading to improper boundary processing. Such case is described in more concrete terms with reference to FIGS. 50A to 55.

FIG. 50A shows a kind of design layout data 23 for an LSI. First, the graphic data processing area split means 3 splits the design layout data 23 including a redundant area 9, as shown in FIG. 50B. Thereafter overlap removal processing is performed every graphic data processing area 8. FIG. 50C shows a part of FIG. 50B in an enlarged manner. Namely, FIG. 50C shows first and second adjacent graphic data processing areas 8a and 8b, first and second redundant areas 9a and 9b provided for the first and second graphic data processing areas 8a and 8b, and pattern data 24.

FIG. 51 shows only the pattern data 24 extending across the boundary between the first and second graphic data processing areas 8a and 8b in an extracted manner. FIGS. 52A and 52B show the first and second graphic data processing areas 8a and 8b shown in FIG. 51 in a separated state. In the stage shown in FIGS. 52A and 52B, the pattern data 24 is already split into basic graphics, so that the first and second graphic data processing areas 8a and 8b hold first and second portions 24a and 24b of the pattern data 24 respectively. Boundary processing is performed in the respective graphic data processing areas 8a and 8b on the basis of the aforementioned boundary processing flow chart.

Consequently, the first and second portions 24a and 24b become 24a' and 24b' respectively, as shown in FIGS. 53A and 53B. FIGS. 54A and 54B show further basic graphics split from the states shown in FIGS. 53A and 53B respectively. After such splitting into the basic graphics, first and second portions 24a" and 24b" are connected with each other again, as shown in FIG. 55. Consequently, pattern data 24' is obtained. However, this pattern data 24' is deficient, as shown in FIG. 55. Such deficiency of the graphic data disadvantageously results in deterioration of the dimensional accuracy of the writing pattern.

SUMMARY OF THE INVENTION

The present invention has been proposed in order to solve the aforementioned problems. An object of the present invention is to provide a electron beam writing data creating device which can effectively suppress deterioration of dimensional accuracy of a writing pattern.

The electron beam writing data creating device according to the present invention comprises graphic data processing area split means, redundant part split means, overlap removal means, and redundant part removal means. The graphic data processing area split means is adapted to split design layout data for forming a plurality of graphic data processing areas having redundant areas around the same so that adjacent graphic data processing areas are in contact with each other while the redundant areas of the graphic data processing areas overlap with the adjacent graphic data processing areas. The redundant part split means is adapted to split the design layout data into internal areas defined in the graphic data processing areas by the outer peripheries of the redundant areas of the adjacent graphic data processing areas and redundant parts connecting all redundant areas. The overlap removal means is adapted to remove overlap of graphic data in the internal areas and the redundant parts independently of each other. The redundant part removal means is adapted to remove overlap of the graphic data in the redundant parts on the boundaries between the graphic data processing areas.

The electron beam writing data creating device preferably further comprises graphic repair means for reconfiguring the graphic data with basic graphics after the redundant part removal means removes overlap of the graphic data in the redundant parts.

The graphic repair means preferably comprises graphic extract means for extracting graphic data which are in contact with the outer peripheries of the redundant parts, contouring means for contouring the extracted graphic data, and contoured graphic split means for splitting the contoured graphic data into basic graphics.

Further, the graphic extract means preferably has a function of selectively extracting only small graphic data and graphic data in contact with the small graphic data. The term "small graphic data" indicates graphic data of a size to deteriorate resist dimensional accuracy, and is generally defined as graphic data having a length of not more than about 0.5 $\mu$m on a side defining either the width or the height thereof.

The graphic repair means preferably includes unnecessary split line removal means for removing unnecessary split lines for the graphic data in the graphic data processing areas, and re-split means for re-splitting the graphic data into basic graphics after the unnecessary split line removal means removes the unnecessary split lines.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B illustrate a fourth one of the characteristic processing steps employing the electron beam writing data creating device shown in FIG. 1;

FIGS. 12A and 12B illustrate a third one of the characteristic processing steps employing the electron beam writing data creating device shown in FIG. 9;

FIGS. 13A and 13B illustrate a fourth one of the characteristic processing steps employing the electron beam writing data creating device shown in FIG. 9;

FIGS. 14A and 14B illustrate a fifth one of the characteristic processing steps employing the electron beam writing data creating device shown in FIG. 9;

FIG. 15 illustrates a sixth one of the characteristic processing steps employing the electron beam writing data creating device shown in FIG. 9;

FIG. 51 illustrates a first step of data processing employing the conventional electron beam writing data creating device;

FIGS. 52A and 52B illustrate a second step of the data processing employing the conventional electron beam writing data creating device;

DESCRIPTION OF THE PREFERRED EMBODIMENTS

Embodiments of the present invention are now described with reference to FIGS. 1 to 19.

Embodiment 1

Figure 1:
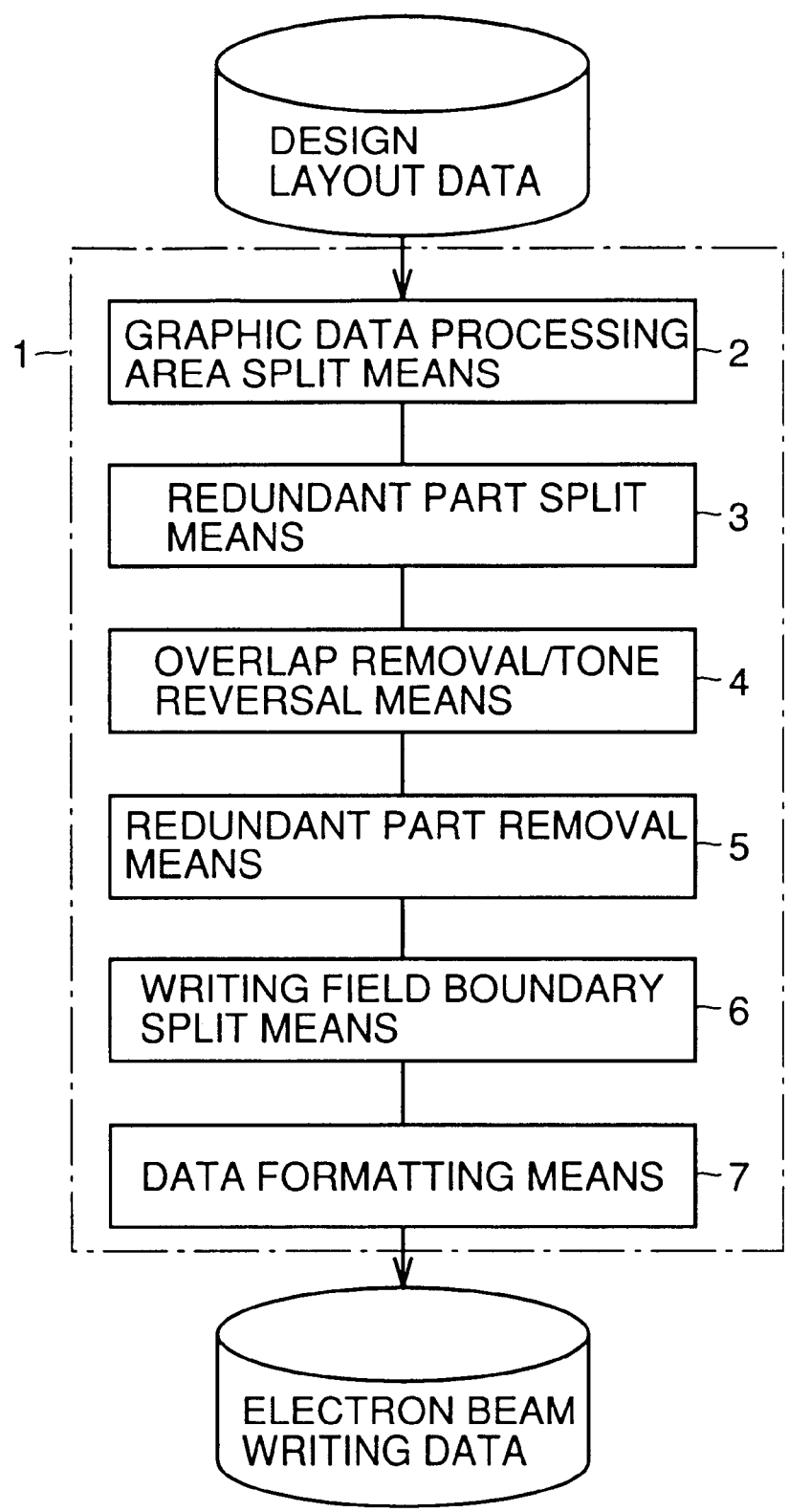
FIG. 1 is a block diagram schematically showing the structure of a electron beam writing data creating device according to an embodiment 1 of the present invention.

With reference to FIGS. 1 to 8, an embodiment 1 of the present invention is now described. FIG. 1 is a block diagram showing the structure of a electron beam writing data creating device 1 according to embodiment 1 of the present invention.

As shown in FIG. 1, the electron beam writing data creating device 1 according to the present invention comprises a graphic data processing area split means 2, a redundant part split means 3, an overlap removal/tone reversal means 4, a redundant part removal means 5, a writing field boundary split means 6, and a data formatting means 7.

The graphic data processing area split means 2 is adapted to split design layout data into graphic data processing areas having redundant areas. The redundant part split means 3 is adapted to split the aforementioned design layout data into redundant parts formed by connecting the redundant areas of the respective graphic data processing areas with each other, and internal areas defined in the graphic data processing areas by the outer peripheries of the redundant parts. The overlap removal/tone reversal means 4 is adapted to perform processing of removing overlap of graphic data in the internal areas and the redundant parts independently of each other and tone reversal processing of generating graphic data in areas having no graphic data. The redundant part removal means 5 is adapted to split the graphic data included in the redundant parts not to generate small graphic data on graphic data processing area boundaries for removing overlap of the graphic data in the redundant parts. The writing field boundary split means 6 has a function of splitting the design layout data into areas on which an electron beam writing system can write graphics only by deflection of an electron beam. The data formatting means 7 is adapted to format the data in a data structure which can be inputted in a desired writing system.

Figure 8A:
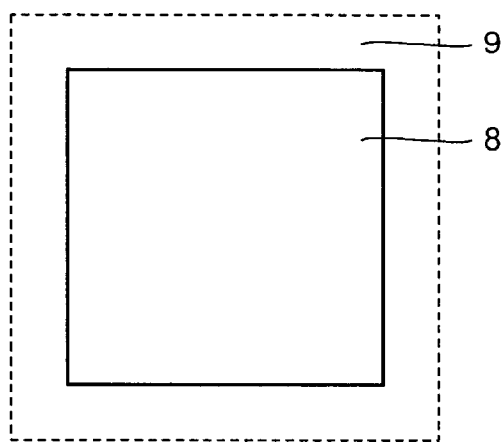
FIG. 8A illustrates a graphic data processing area and a redundant area.
Figure 8B:
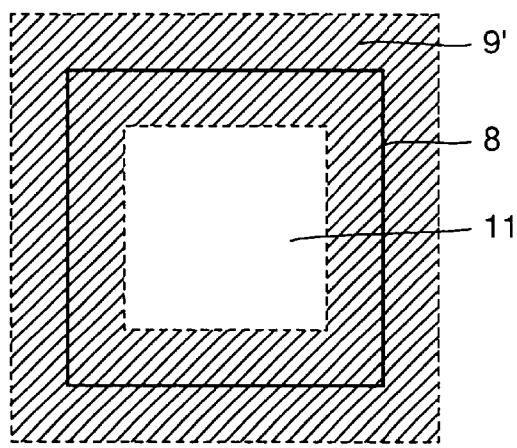
FIGS. 8B and 8C illustrate a redundant part and an internal area according to the present invention with slant lines respectively.
Figure 8C:
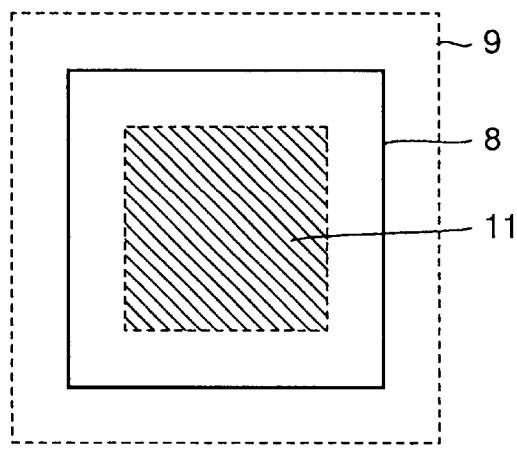

In the aforementioned structure, the most important feature of the electron beam writing data creating device 1 according to the embodiment 1 resides in the provision of the redundant part split means 3. The processing performed by the redundant part split means 3 is described in detail with reference to FIGS. 8A to 8C. FIGS. 8A to 8C show areas defined by the electron beam writing data creating device 1 according to the embodiment 1.

Figure 55:
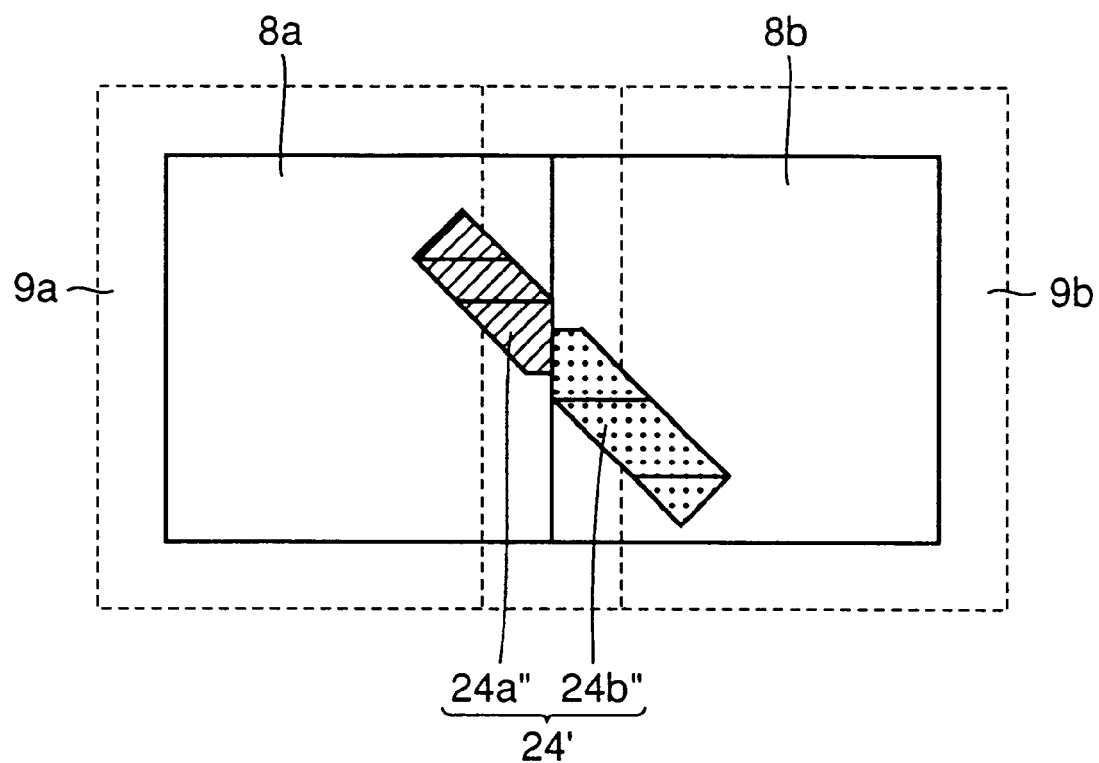
FIG. 55 illustrates a fifth step of the data processing employing the conventional electron beam writing data creating device.

FIG. 8A shows a graphic data processing area 8 and a redundant area 9, which are defined by the graphic data processing area split means 2. FIG. 8B shows a redundant part 9', and FIG. 8C shows an internal area 11 defined in the graphic data processing area 8 by the outer periphery of the redundant part 9'. The aforementioned redundant part split means 3 defines the internal area 11 and the redundant part 9'. The aforementioned overlap removal/tone reversal processing is performed in the internal area 11 and the redundant part 9' independently of each other. Thus, a graphic data group in the redundant part 9' can be recognized as the same shape from any of adjacent graphic data processing areas 8. Consequently, it is possible to effectively inhibit deficiency resulting on pattern data 24' extending across a graphic data processing area boundary as shown in FIG. 55.

With reference to FIGS. 2 to 7, the characteristic processing of the electron beam writing data creating device 1 according to the embodiment 1 is now described. FIGS. 2 to 7 show the characteristic processing of the electron beam writing data creating device 1 according to the embodiment 1 stepwise.

Figure 2:
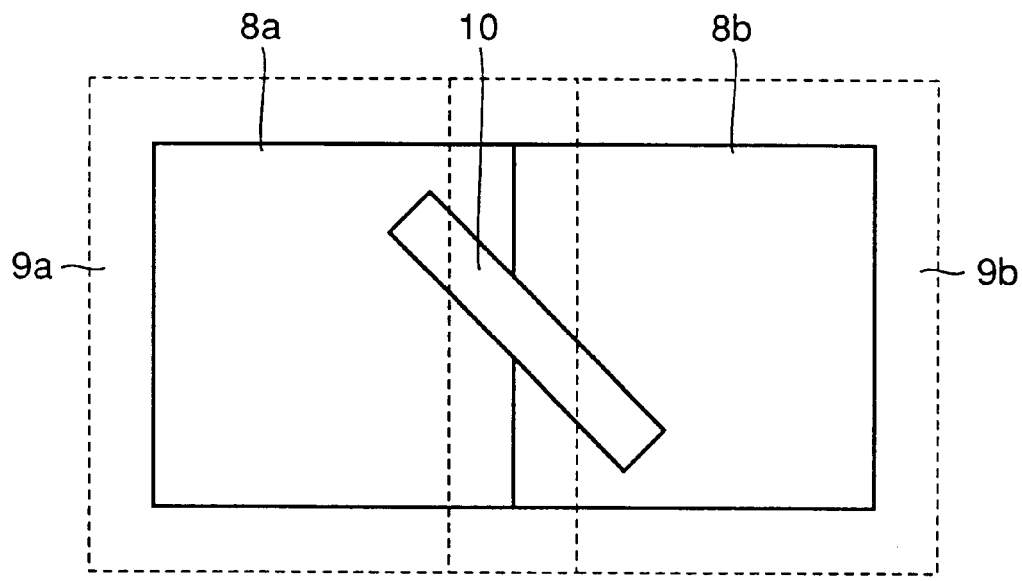
FIGS. 2 and 3 illustrate first and second ones of characteristic processing steps employing the electron beam writing data creating device shown in FIG. 1.

As shown in FIG. 2, the graphic data processing area split means 2 first defines first and second graphic data processing areas 8*a* and 8*b* and first and second redundant areas 9*a* and 9*b*. For the purpose of comparison with the prior art, it is assumed that pattern data 10 is formed to extend across the boundary between the first and second graphic data processing areas 8*a* and 8*b*.

Figure 3:
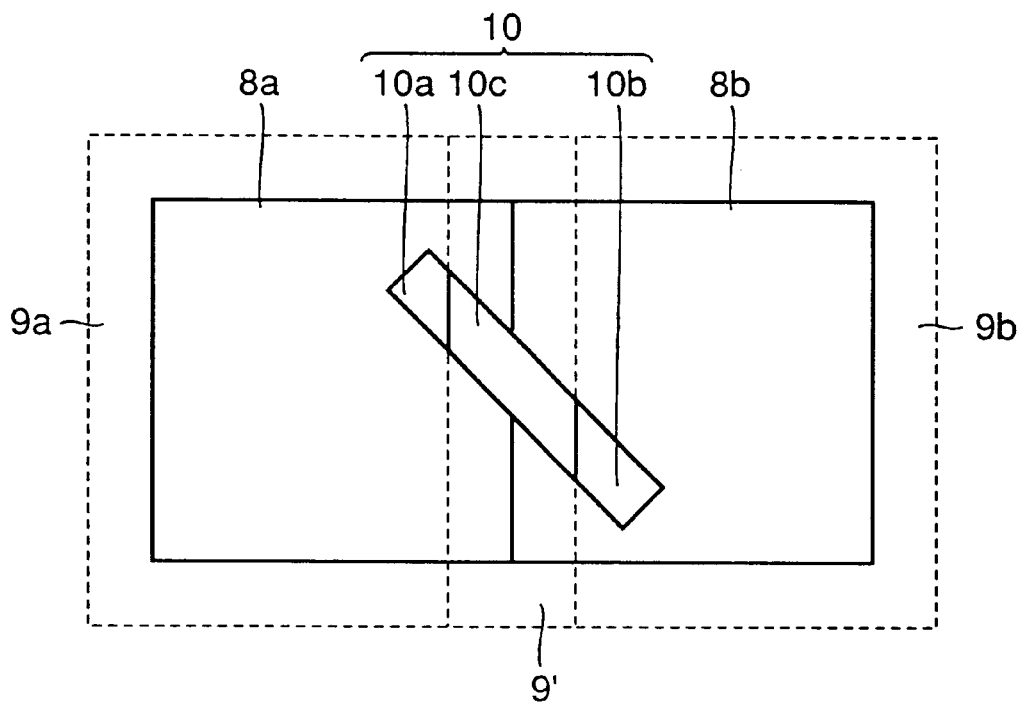

Then, the redundant part split means 3 splits the pattern data 10 into a portion 10*c* positioned in the redundant part 9' and portions 10*a* and 10*b* positioned in the first and second graphic data processing areas 8*a* and 8*b* respectively, as shown in FIG. 3. The redundant part 9' is formed by connecting the redundant areas 9*a* and 9*b* positioned on both sides of the boundary between the first and second graphic data processing areas 8*a* and 8*b*.

Figure 4A:
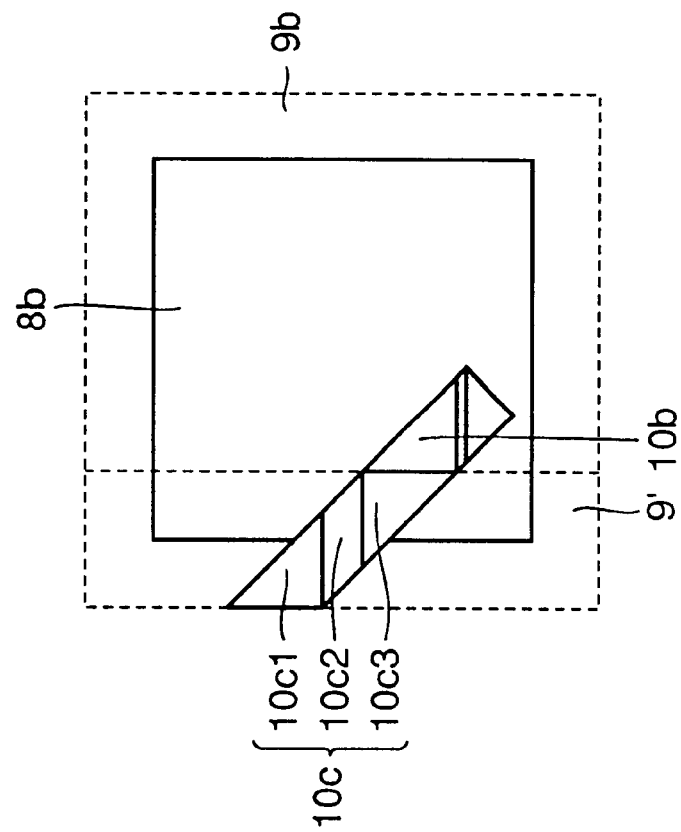
FIGS. 4A and 4B illustrate a third one of the characteristic processing steps employing the electron beam writing data creating device shown in FIG. 1.
Figure 4B:
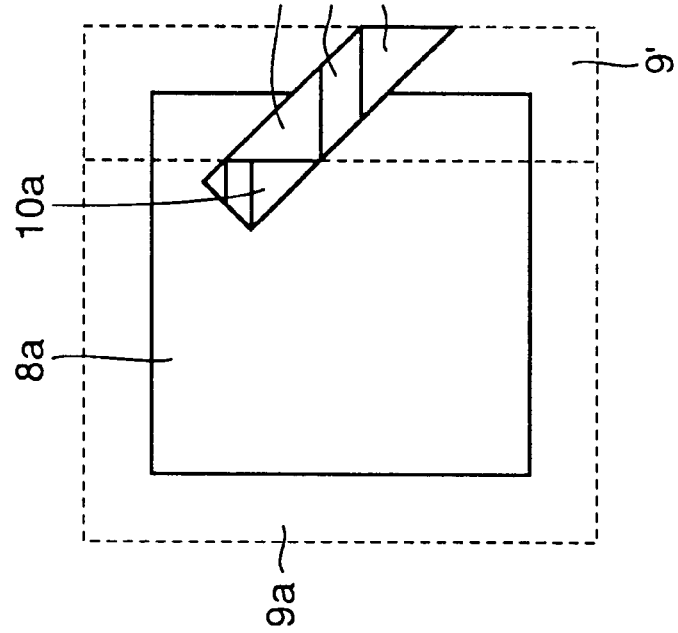

Then, overlap removal processing is performed on the portions 10*a* and 10*b* in internal areas positioned in the first and second graphic data processing areas 8*a* and 8*b* and the portion 10*c* positioned in the redundant part 9' respectively independently of each other, as shown in FIGS. 4A and 4B. Thus, the portion 10*c* positioned in the redundant part 9' can be recognized in the same shapes as viewed from the first and second graphic data processing areas 8*a* and 8*b*. In more concrete terms, the portion 10*c* positioned in the redundant part 9' can be split into basic graphics 10*c*1, 10*c*2 and 10*c*3 of the same shapes.

Figure 6A:
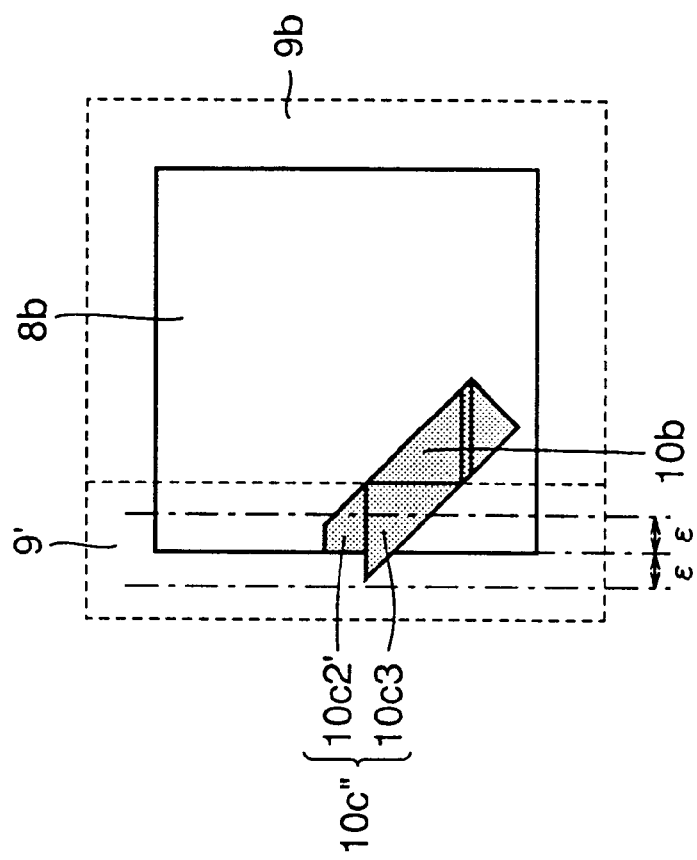
FIGS. 6A and 6B illustrate a fifth one of the characteristic processing steps employing the electron beam writing data creating device shown in FIG. 1.
Figure 6B:
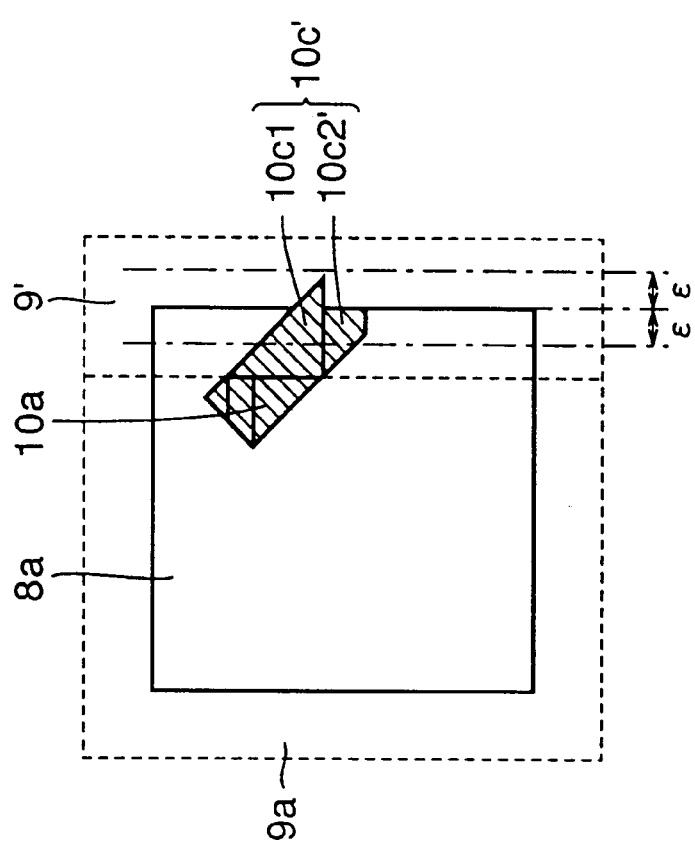
Figure 7:
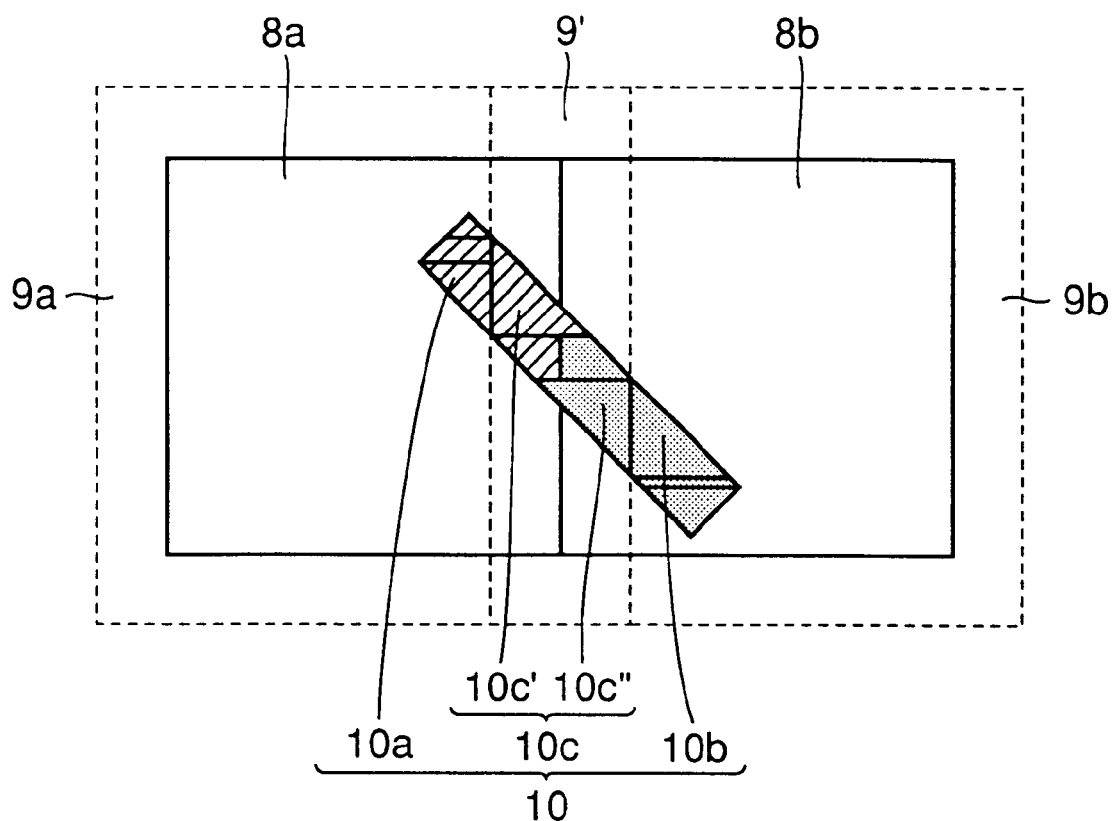
FIG. 7 illustrates a sixth one of the characteristic processing steps employing the electron beam writing data creating device shown in FIG. 1.

Then, redundant part removal processing is performed with a parameter of a small graphic dimension ε, as shown in FIGS. 5A and 5B. FIGS. 6A and 6B show a result of this redundant part removal processing. Due to the redundant part removal processing, a second portion 10*c*2 on the first graphic data processing area 8*a* side is transformed into a portion 10*c*2', and a third portion 10*c*3 on the first graphic data processing area 8*a* side is removed, as shown in FIGS. 6A and 6B. In the second graphic data processing area 8*b*, on the other hand, the first portion 10*c*1 is removed and the second portion 10*c*2 is transformed into a portion 10*c*2'. Consequently, parts of the portion 10*c* of the redundant part 9' held by the first and second graphic data processing areas 8*a* and 8*b* are transformed into portions 10*c*' and 10*c*" respectively. The first and second graphic data processing areas 8*a* and 8*b* are connected with each other, thereby obtaining non-deficient pattern data 10, as shown in FIG. 7.

As hereinabove described, it is possible to effectively inhibit the pattern data 10 obliquely extending across the boundary between the first and second graphic data processing areas 8*a* and 8*b* from being deficient after the redundant part removal processing. Thus, high-quality writing data can be created without depending on the state of the design layout.

Embodiment 2

Figure 9:
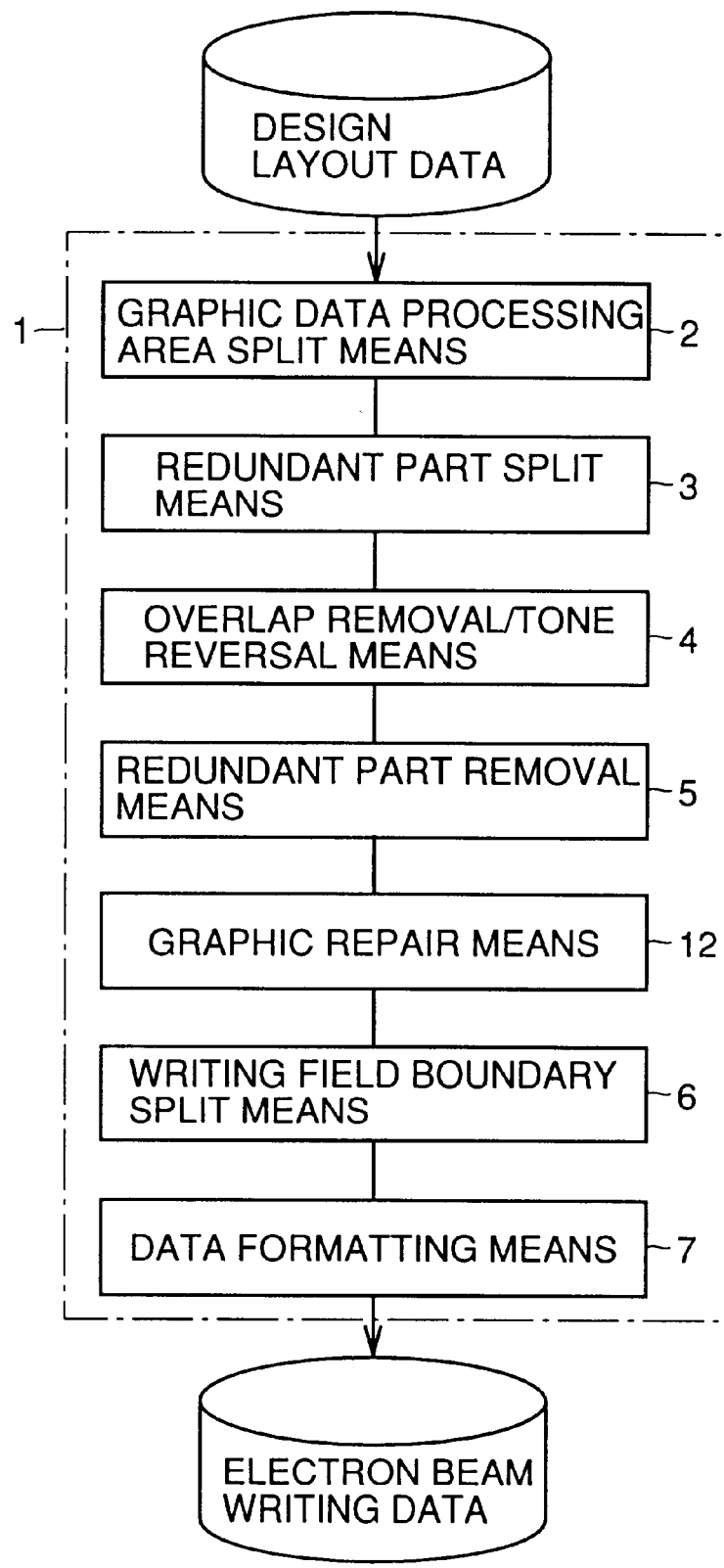
FIG. 9 is a block diagram schematically showing the structure of a electron beam writing data creating device according to a second embodiment of the present invention.

With reference to FIGS. 9 to 17, an embodiment 2 of the present invention is now described. FIG. 9 is a block diagram showing the structure of a electron beam writing data creating device 1 according to the embodiment 2 of the present invention.

While the area of the redundant part 9' is completely separated in the aforementioned embodiment 1 in order to properly perform the redundant part removal processing, small graphics may result from splitting of the graphic along the boundary (hereinafter referred to as "redundant part boundary") between the redundant part 9' and the internal area 11. According to the embodiment 2, therefore, the electron beam writing data creating device 1 comprises a graphic repair means 12, in order to perform graphic repair processing in graphic data processing areas as a step following redundant part removal processing.

The aforementioned graphic repair processing is described with reference to FIGS. 10 to 15. FIGS. 10 to 15 show respective steps of the graphic repair processing in the embodiment 2 stepwise.

Figure 10:
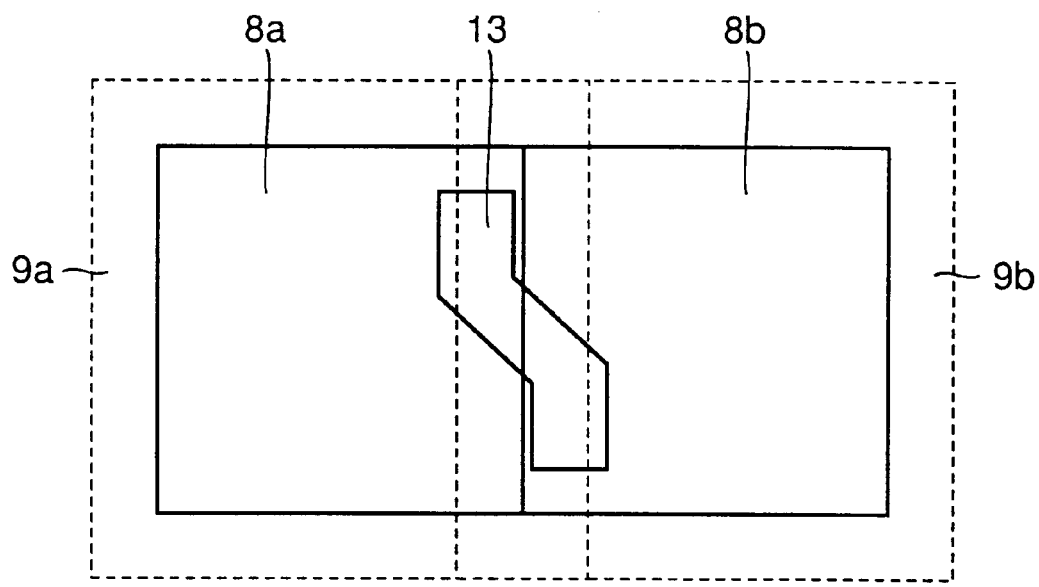
FIGS. 10 and 11 illustrate first and second ones of characteristic processing steps employing the electron beam writing data creating device shown in FIG. 9.

As shown in FIG. 10, first and second graphic data processing areas 8*a* and 8*b* are formed by a method similar to that in the aforementioned embodiment 1 respectively. Referring to FIG. 10, pattern data 13 is formed to extend across the boundary between the first and second graphic data processing areas 8*a* and 8*b*.

Figure 11:
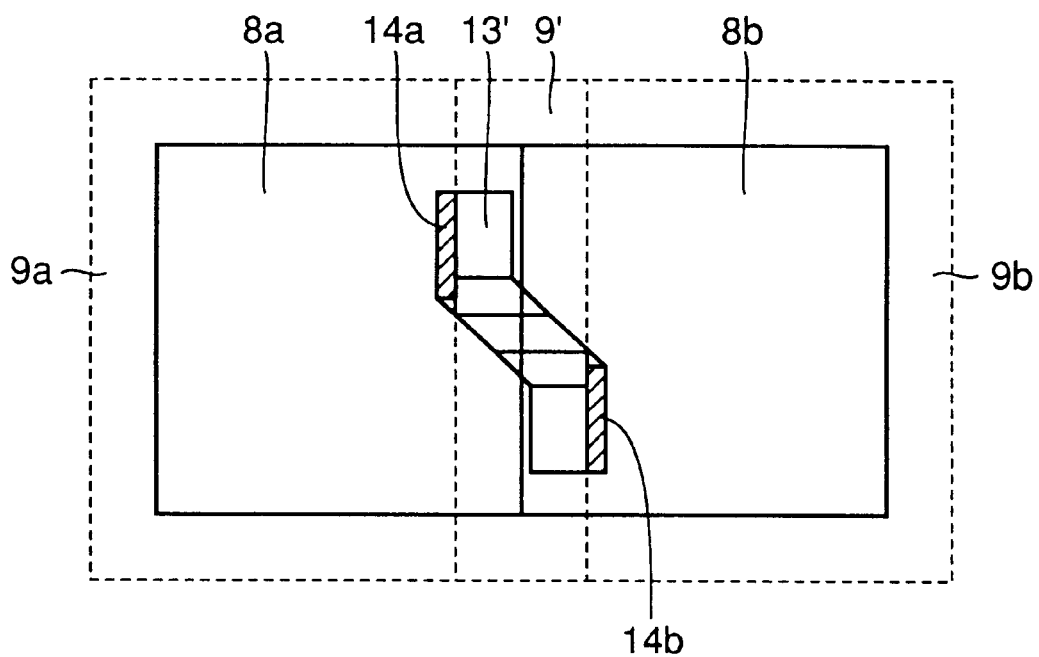

Then, redundant part split processing is performed by a method similar to that in the aforementioned embodiment 1. FIG. 11 shows a result of the redundant part split processing. Due to the redundant part split processing, the pattern data 13 is split into pattern data 13' and small graphic data 14*a* and 14*b* generated on the redundant part boundary.

Then, redundant part removal processing is performed in a method similar to that in the aforementioned embodiment 1, as shown in FIGS. 12A and 12B. Thus, portions 13*a* and 13*b* are formed in parts of a redundant part 9' held by the first and second graphic data processing areas 8*a* and 8*b*, as shown in FIGS. 13A and 13B respectively.

Then, the aforementioned graphic repair means 12 extracts all graphic data which are in contact with the redundant part boundary, for contouring the extracted graphic data. Namely, the graphic repair means 12 contours the extracted graphic data, and removes split lines already provided in the graphic data. Thereafter the graphic repair means 12 re-splits the contoured graphic data into basic graphics. FIGS. 14A and 14B show a result of this processing. As shown in FIGS. 14A and 14B, new pattern data 13*a*' and 13*b*' held by the first and second graphic data processing areas 8*a* and 8*b* respectively are defined. Thus, it is possible to effectively suppress generation of the small graphic data 14*a* and 14*b* which are in contact with the redundant part boundary.

After the aforementioned graphic repair processing, the first and second graphic data processing areas 8*a* and 8*b* are connected with each other, as shown in FIG. 15. Consequently, generation of small graphics on the redundant part boundary can be effectively suppressed, while deficiency of pattern data 13" resulting from the connection can also be effectively suppressed.

Figure 16:
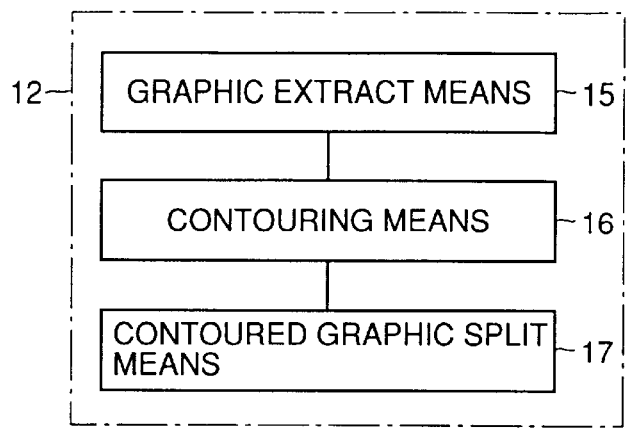
FIG. 16 is a block diagram showing an exemplary structure of a graphic repair means according to the present invention.
Figure 17:
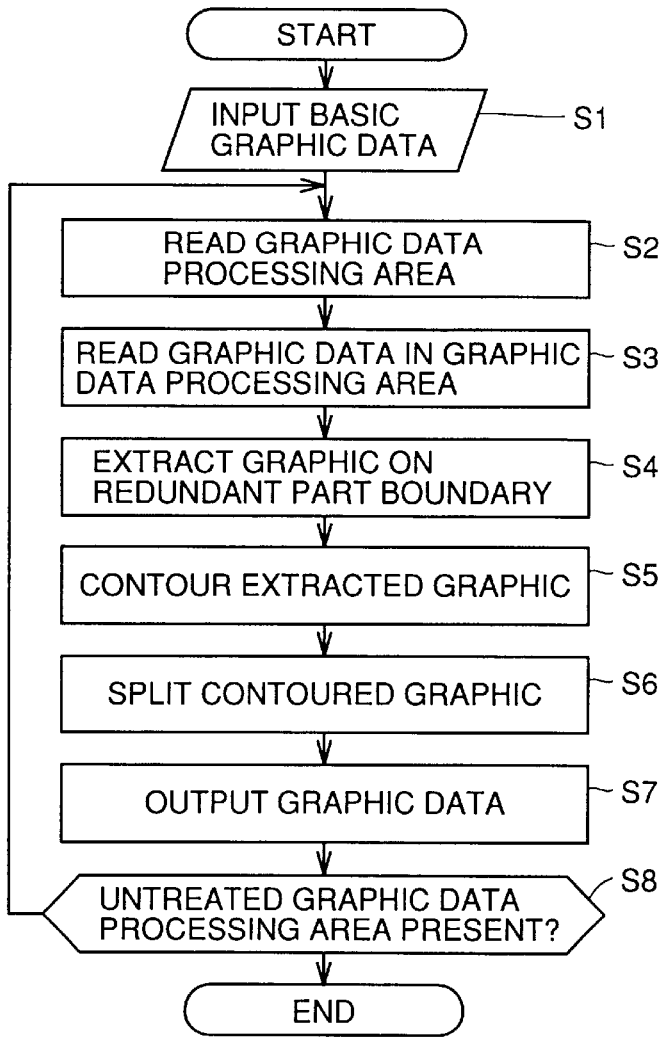
FIG. 17 is a flow chart for illustrating graphic repair processing employing the graphic repair means shown in FIG. 16.

An exemplary structure of the aforementioned graphic repair means 12 and an outline of the graphic repair processing are described with reference to FIGS. 16 and 17. FIG. 16 is a block diagram showing the exemplary structure of the graphic repair means 12. FIG. 17 is a flow chart of the graphic repair processing.

Referring to FIG. 16, the graphic repair means 12 according to the embodiment 2 comprises a graphic extract means 15 for extracting all graphic data which are in contact with redundant part boundaries, a contouring means 16 for contouring the extracted graphic data, and a contoured graphic split means 17 for splitting the contoured graphic data into basic graphics.

In the graphic repair processing, basic graphic data are first inputted at a step S1, and graphic data processing areas are read at a step S2, as shown in FIG. 17.

Then, the graphic data in the graphic data processing areas are read at a step S3, and the graphic extract means 15 extracts the graphic data positioned on the redundant part boundaries at a step S4.

Then, the contouring means 16 contours the extracted graphic data at a step S5, and the contoured graphic split means 17 splits the contoured graphic data into basic graphics at a step S6. Thereafter the graphic data split into the basic graphics are outputted at a step S7. A determination is made on presence/absence of unprocessed graphic data processing area at a step S8, and the processing is ended if the determination is of NO.

While all graphic data which are in contact with the redundant part boundaries are extracted in the flow chart shown in FIG. 17, only small graphic data which are in contact with the redundant part boundaries and graphic data which are in contact with both the small graphic data and the redundant part boundaries may alternatively be extracted. It is possible to reduce the number of elements processed after the graphic extraction by adding such a function to the graphic extract means 15. Thus, the processing can be speeded up.

Embodiment 3

Figure 18:
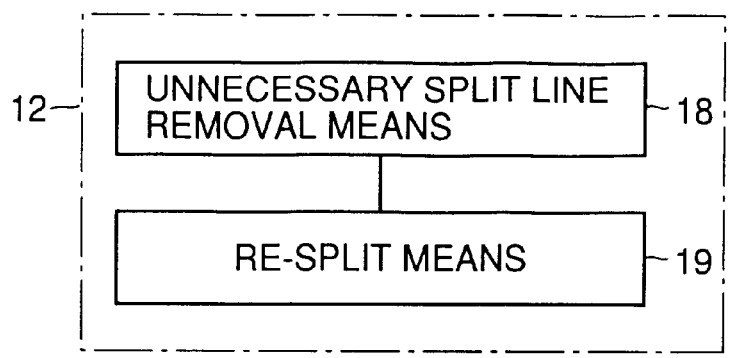
FIG. 18 is a block diagram showing another exemplary structure of the graphic repair means according to the present invention.
Figure 19:
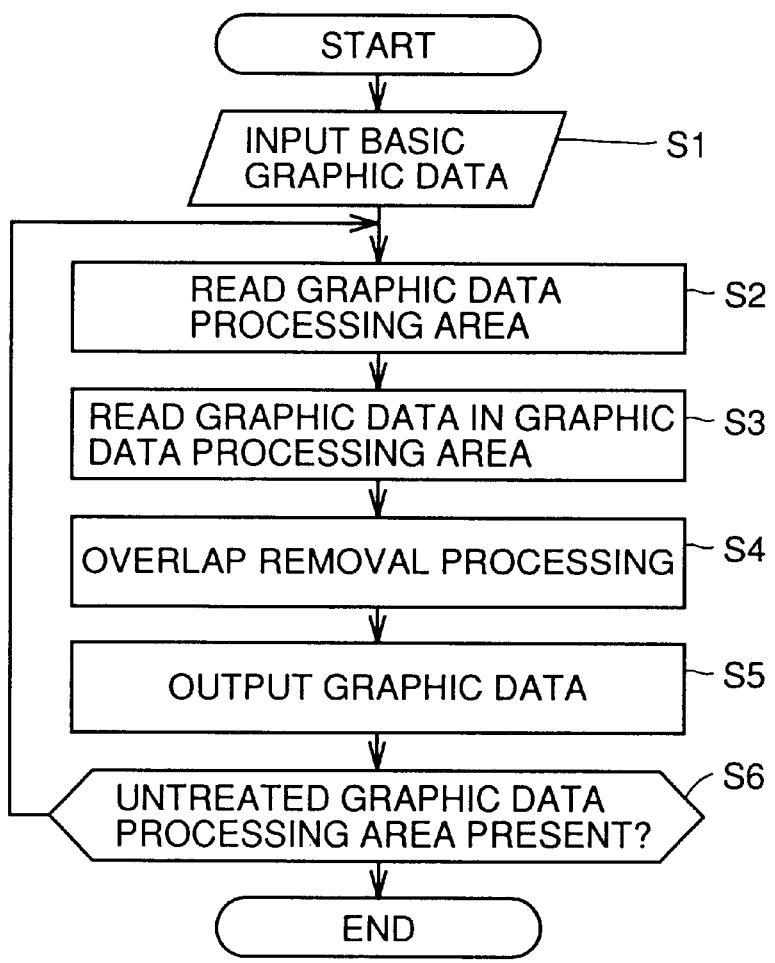
FIG. 19 is a flow chart for illustrating graphic repair processing employing the graphic repair means shown in FIG. 18.
Figure 20:
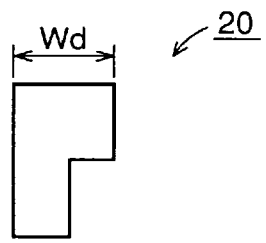
FIG. 20 illustrates exemplary pattern data.
Figure 21:
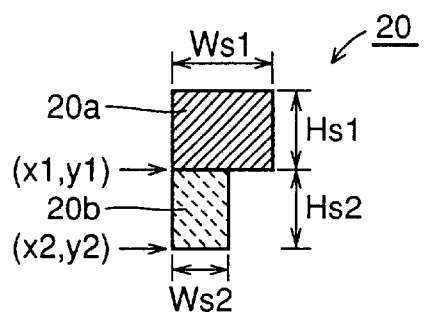
FIG. 21 illustrates the pattern data shown in FIG. 20 split by a horizontal split line.
Figure 22:
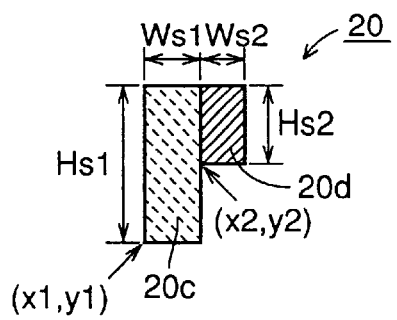
FIG. 22 illustrates the pattern data shown in FIG. 20 split by a vertical horizontal split line.
Figure 23:
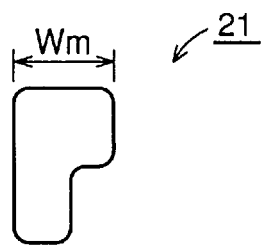
FIG. 23 illustrates the shape of a resist pattern formed on a mask through the pattern data shown in FIG. 20.
Figure 24:
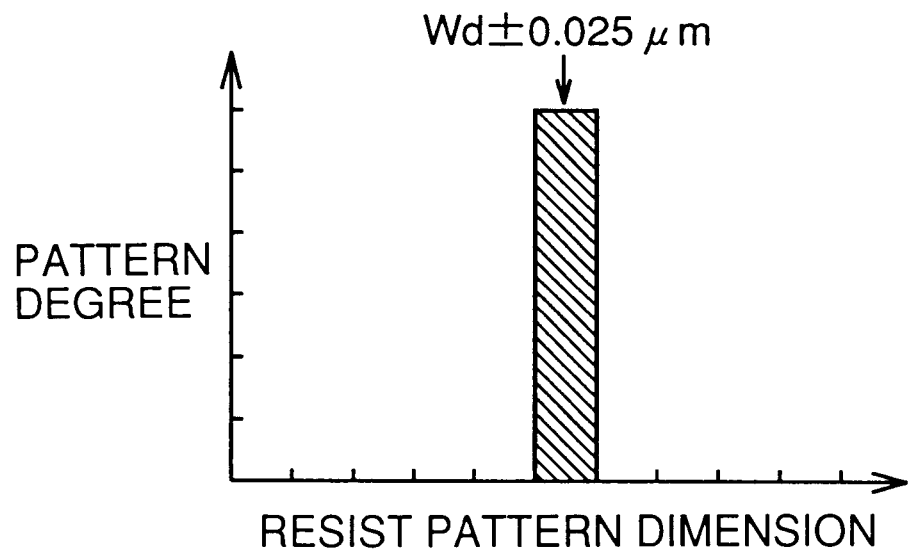
FIG. 24 illustrates dispersion of resist pattern dimensions on a mask in case of writing a graphic a one-shot electron beam.
Figure 25:
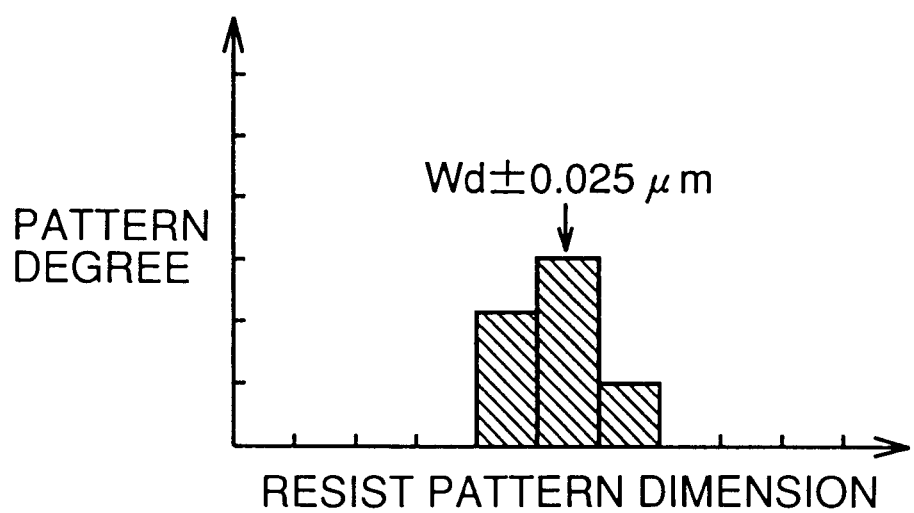
FIG. 25 illustrates dispersion of resist pattern dimensions on a mask in case of writing a graphic a two-shot electron beam.
Figure 26A:
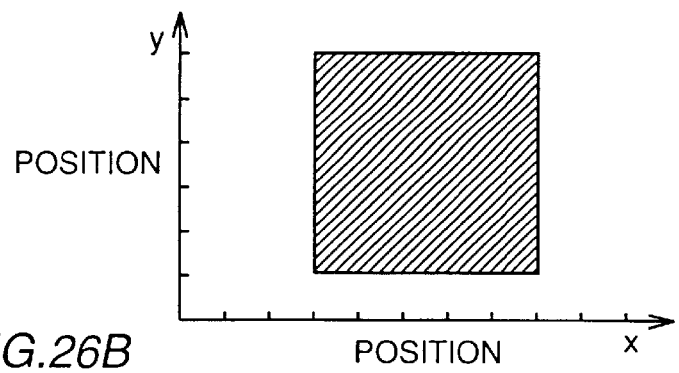
FIGS. 26A and 26B illustrate a graphic written with a one-shot electron beam and intensity distribution of the electron beam respectively.
Figure 26B:
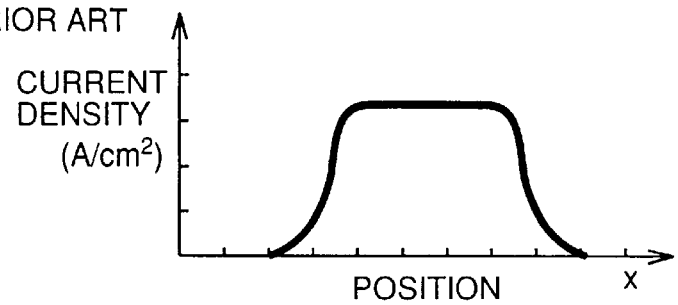
Figure 27A:
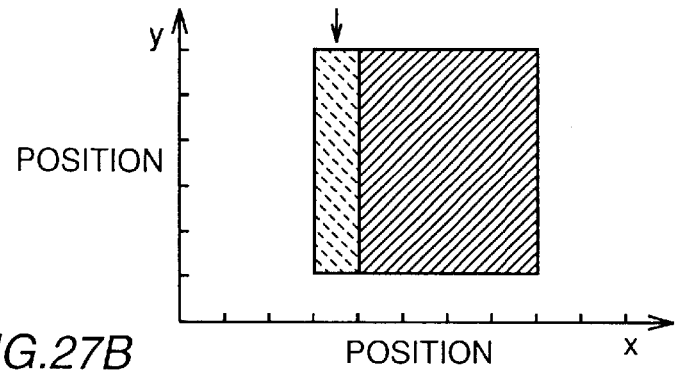
FIGS. 27A and 27B illustrate a graphic written with a two-shot electron beam and intensity distribution of the electron beam respectively.
Figure 27B:
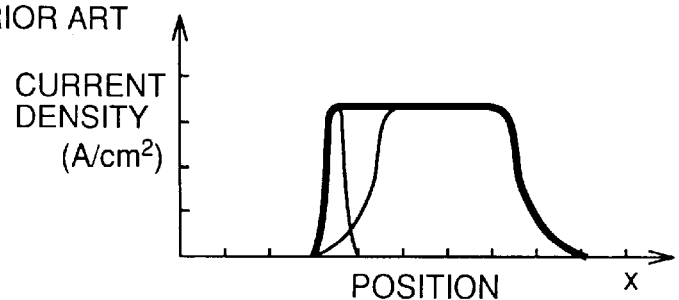
Figure 28:
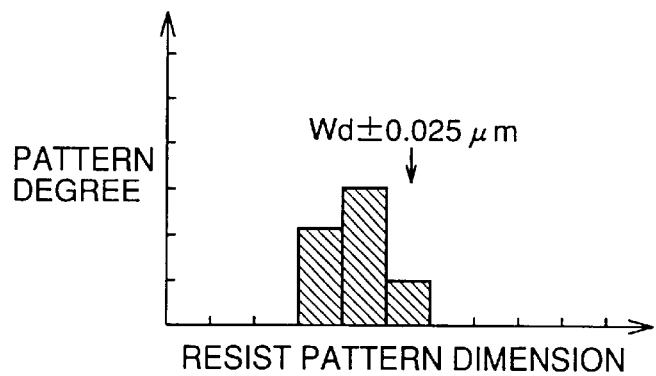
FIG. 28 illustrates dispersion of resist pattern dimensions on a mask in case of writing a graphic with a two-shot electron beam including those of small sizes.
Figure 29:
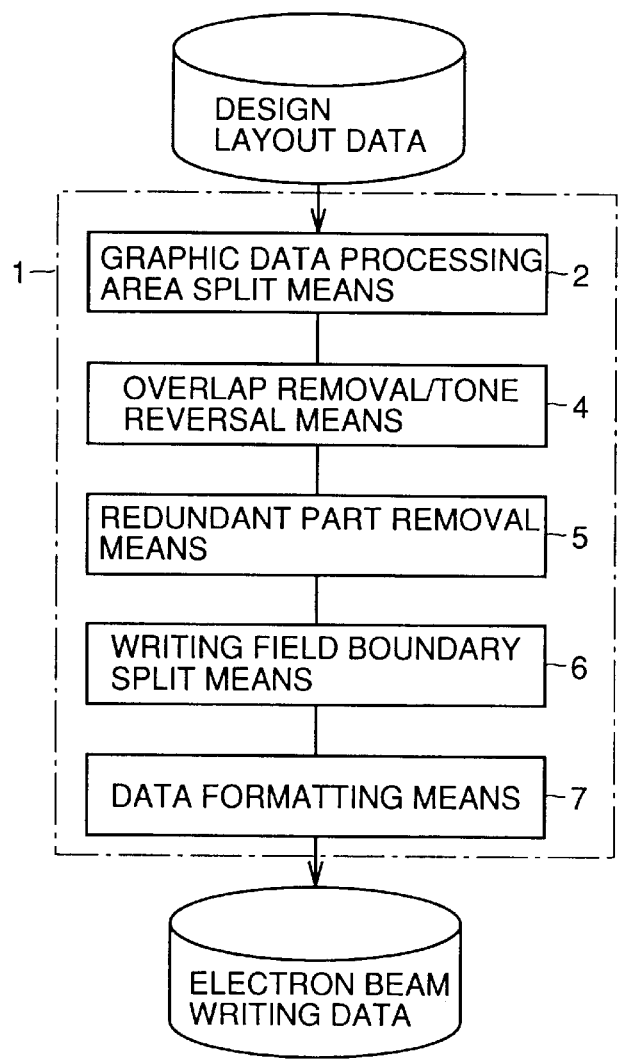
FIG. 29 is a block diagram schematically showing the structure of a conventional electron beam writing data creating device.
Figure 30A:
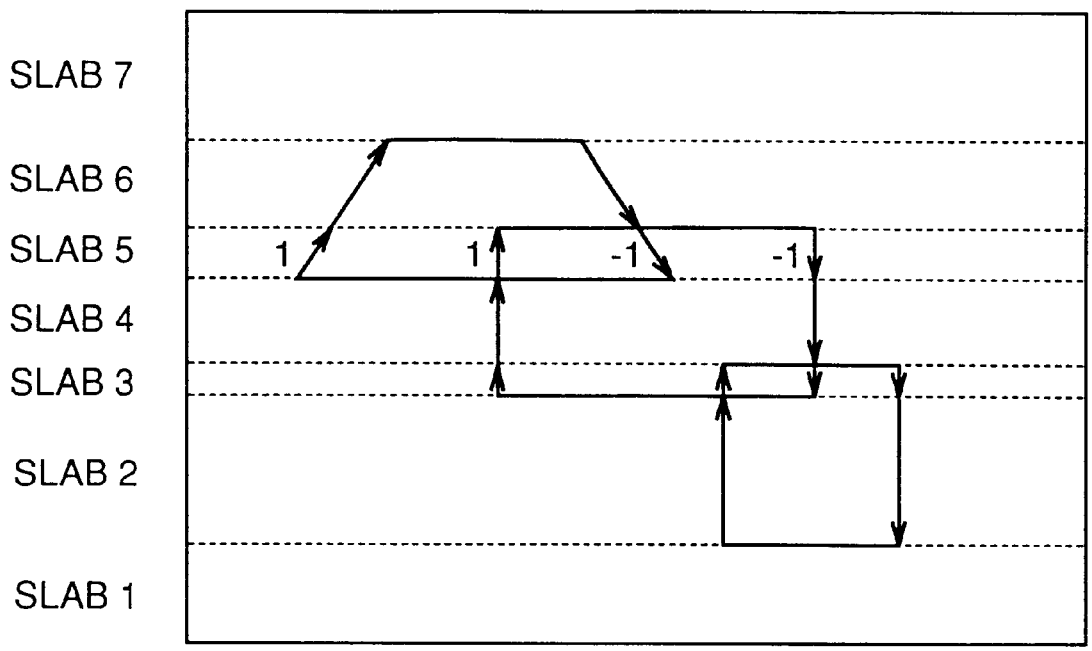
FIGS. 30A and 30B are adapted to illustrate processing for removing overlap of graphics (slab method)
Figure 30B:
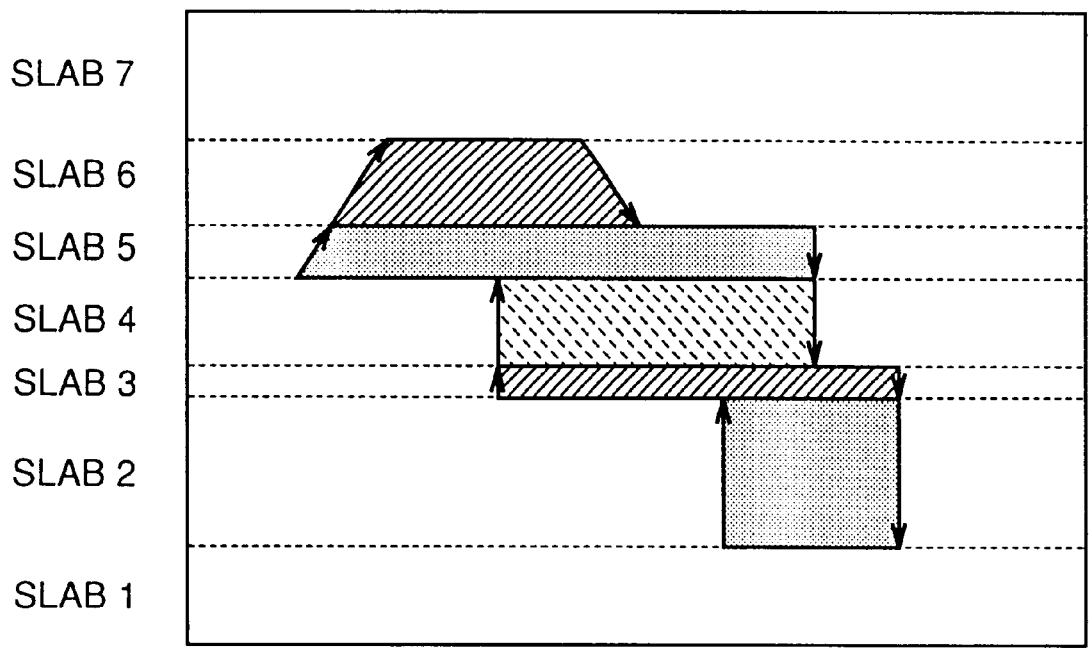
Figure 31:
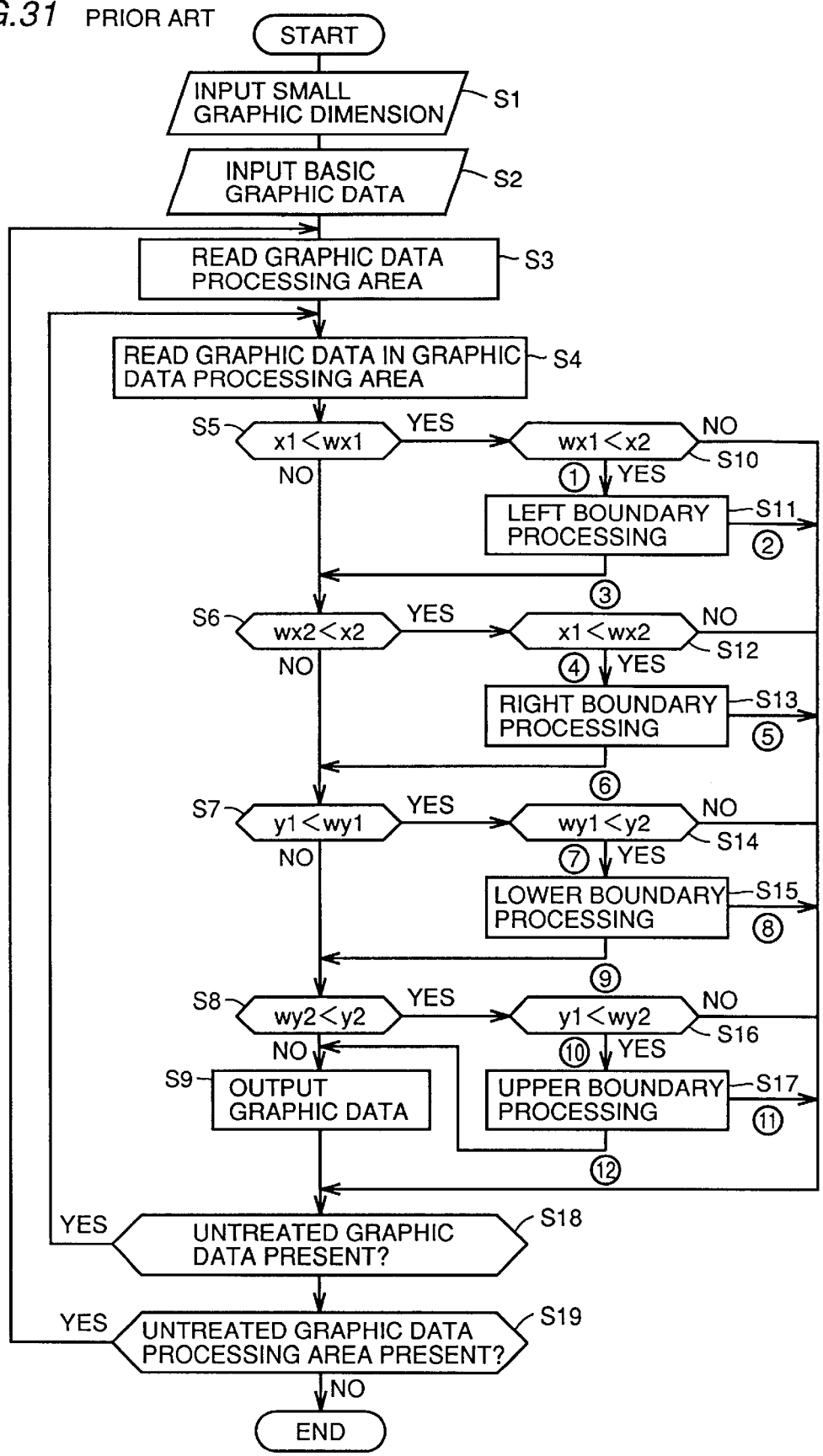
FIG. 31 is a flow chart showing redundant part removal processing.
Figure 32A:
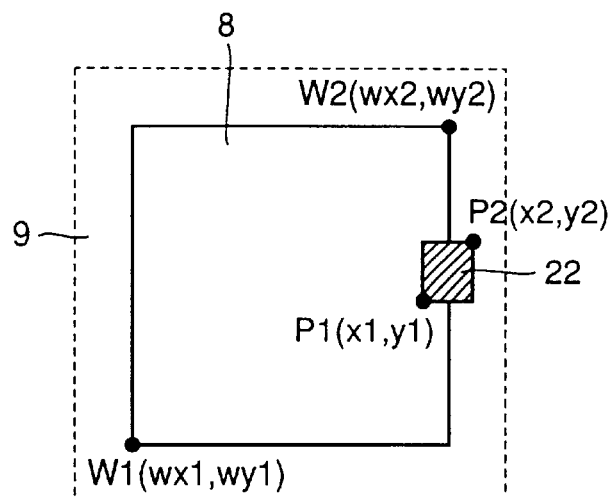
FIGS. 32A to 32C are adapted to illustrate types of graphic areas subjected to the redundant part removal processing.
Figure 32B:
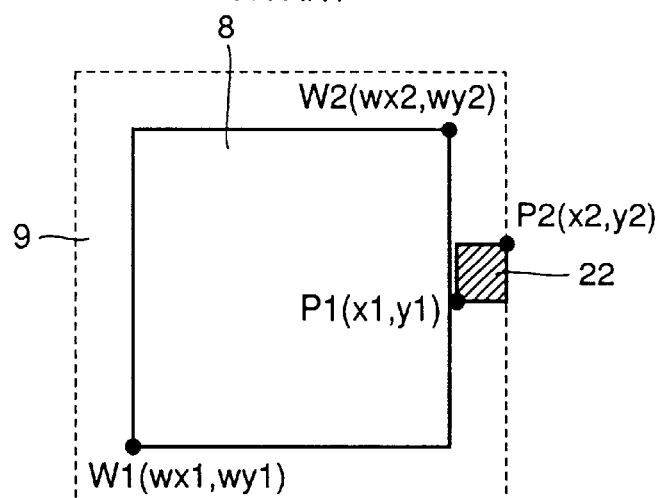
Figure 32C:
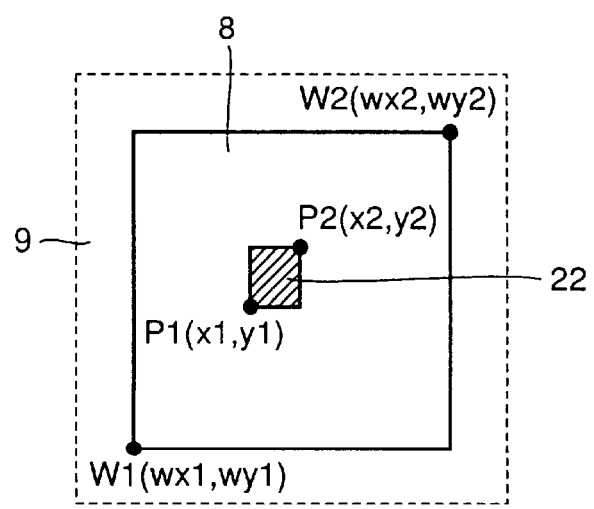
Figure 33:
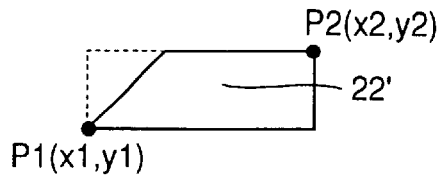
FIG. 33 illustrates a graphic area having trapezoidal graphic data.
Figure 34:
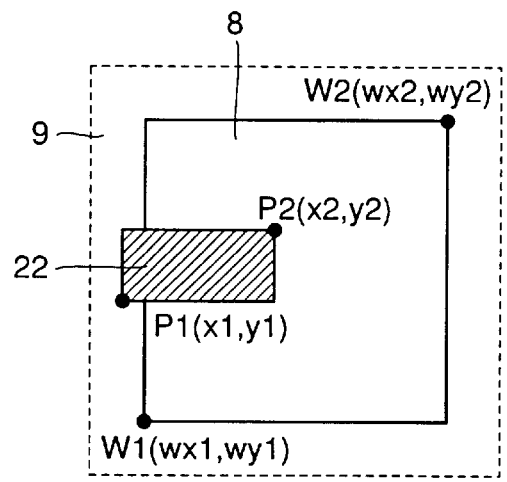
FIG. 34 illustrates a graphic area extending across a left side of a graphic data processing area.
Figure 35:
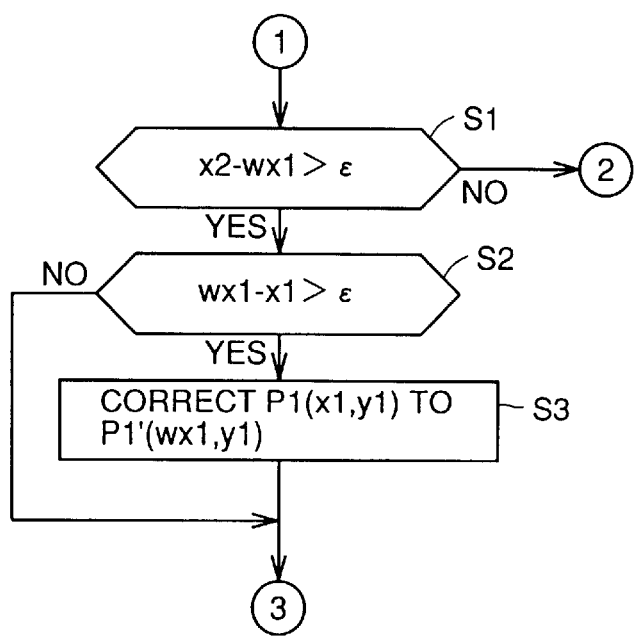
FIG. 35 is a flow chart showing boundary processing for the graphic area extending across the left side of the graphic data processing area.
Figure 36:
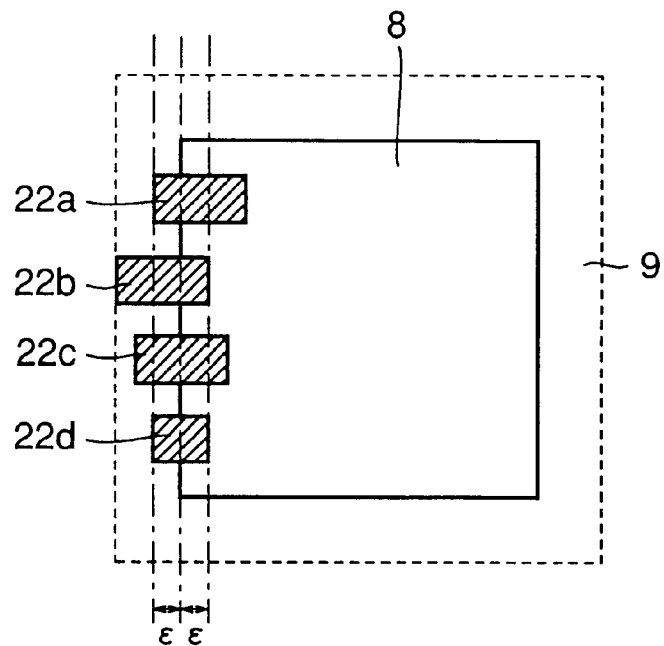
FIGS. 36 and 37 illustrate first and second steps of the boundary processing shown in FIG. 35 respectively.
Figure 37:
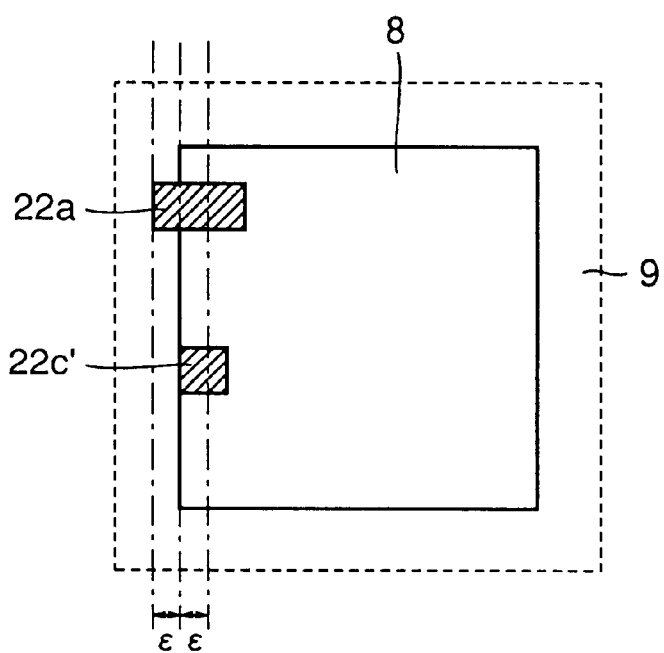
Figure 38:
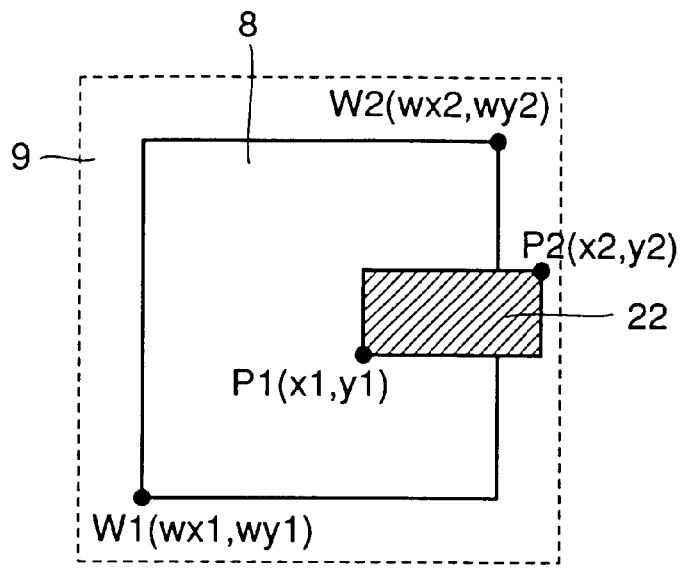
FIG. 38 illustrates a graphic area extending across a right side of a graphic data processing area.
Figure 39:
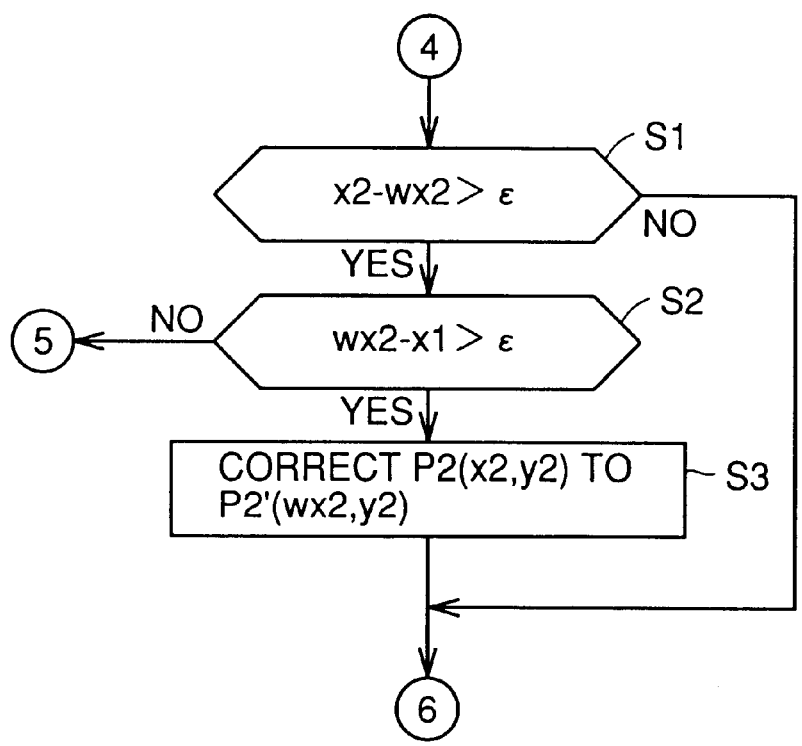
FIG. 39 is a flow chart showing boundary processing for the graphic area extending across the right side of the graphic data processing area.
Figure 40:
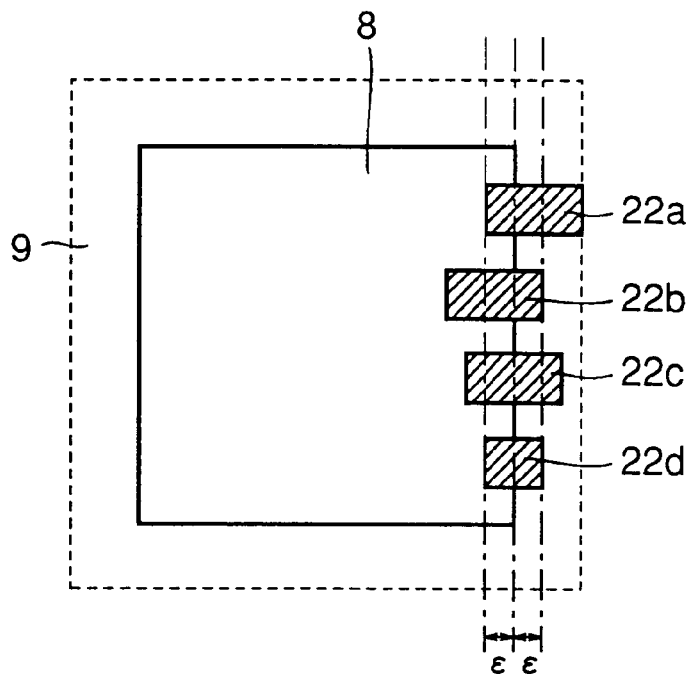
FIGS. 40 and 41 illustrate first and second steps of the boundary processing shown in FIG. 39 respectively.
Figure 41:
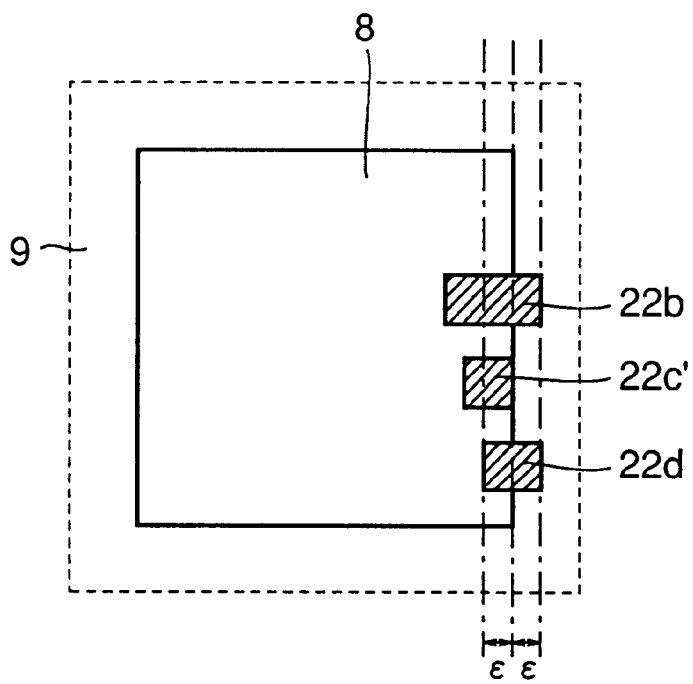
Figure 42:
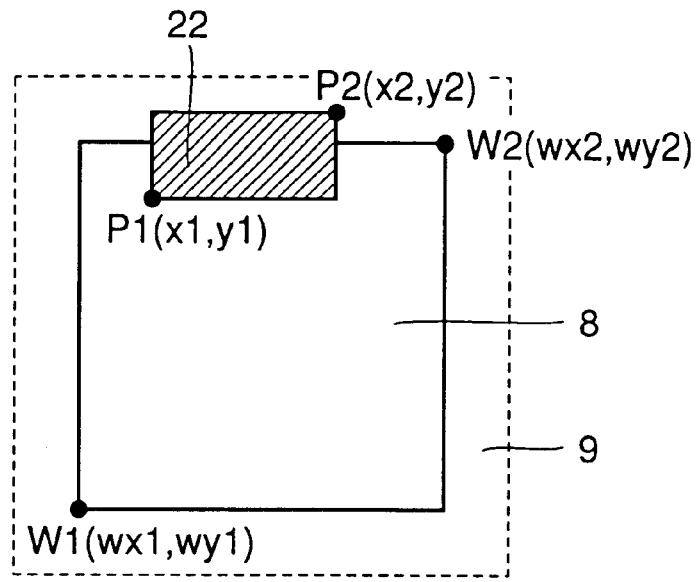
FIG. 42 illustrates a graphic area extending across an upper side of a graphic data processing area.
Figure 43:
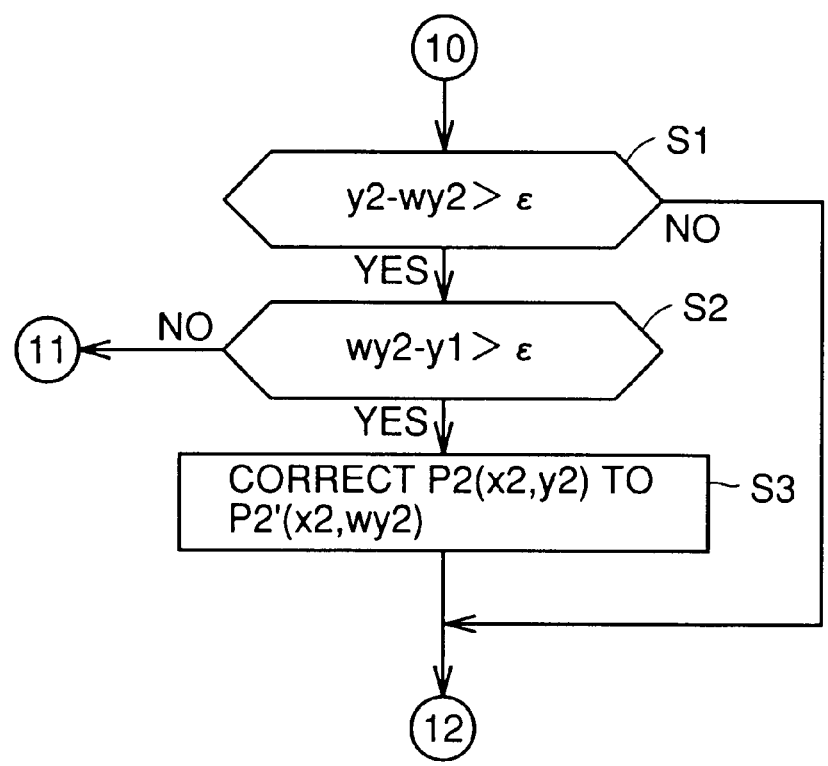
FIG. 43 is a flow chart showing boundary processing for the graphic area extending across the upper side of the graphic data processing area.
Figure 44:
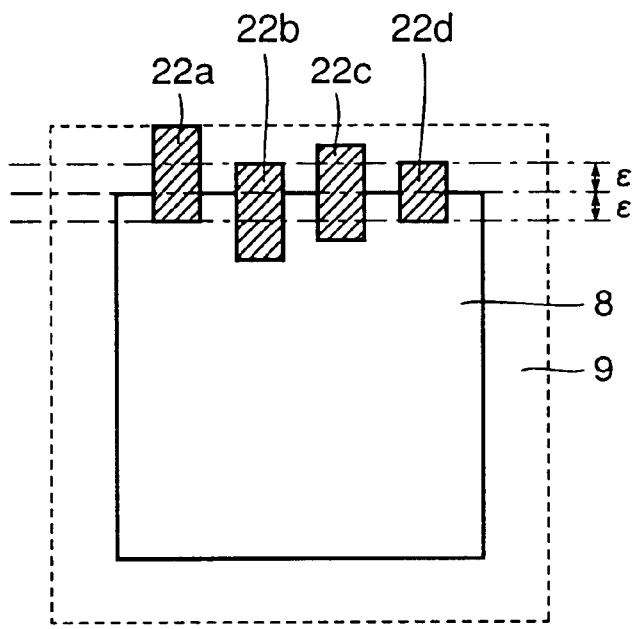
FIGS. 44 and 45 illustrate first and second steps of the boundary processing shown in FIG. 43 respectively.
Figure 45:
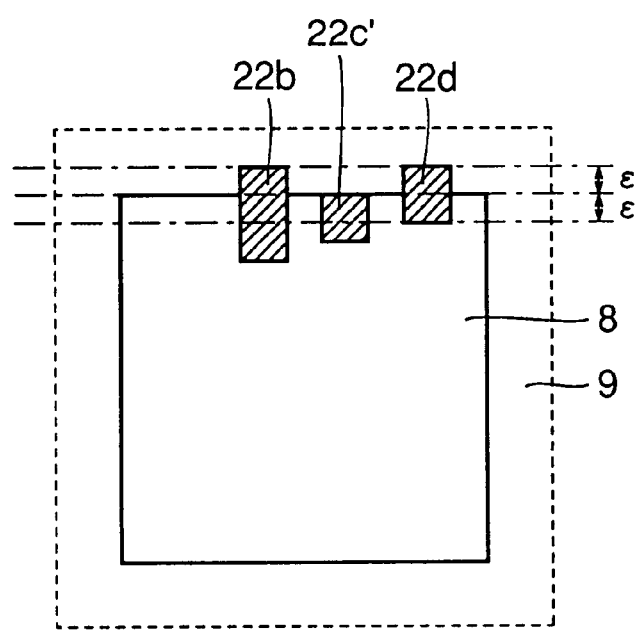
Figure 46:
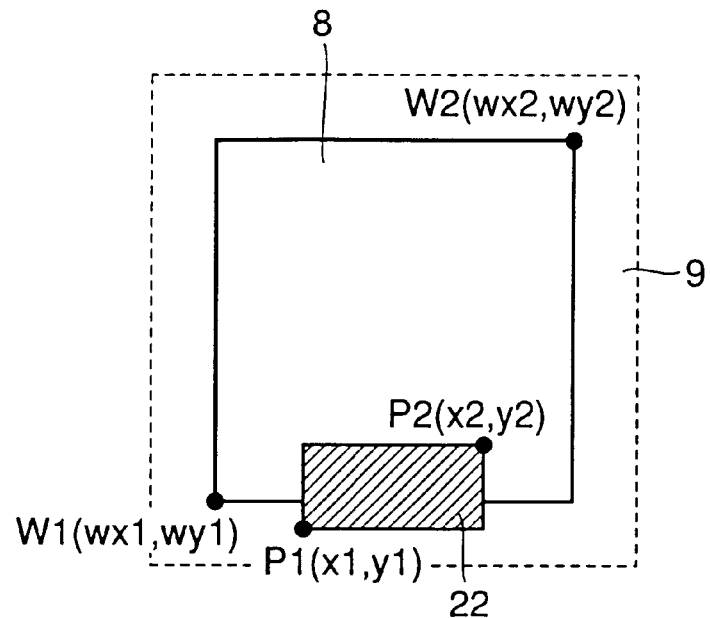
FIG. 46 illustrates a graphic area extending across a lower side of a graphic data processing area.
Figure 47:
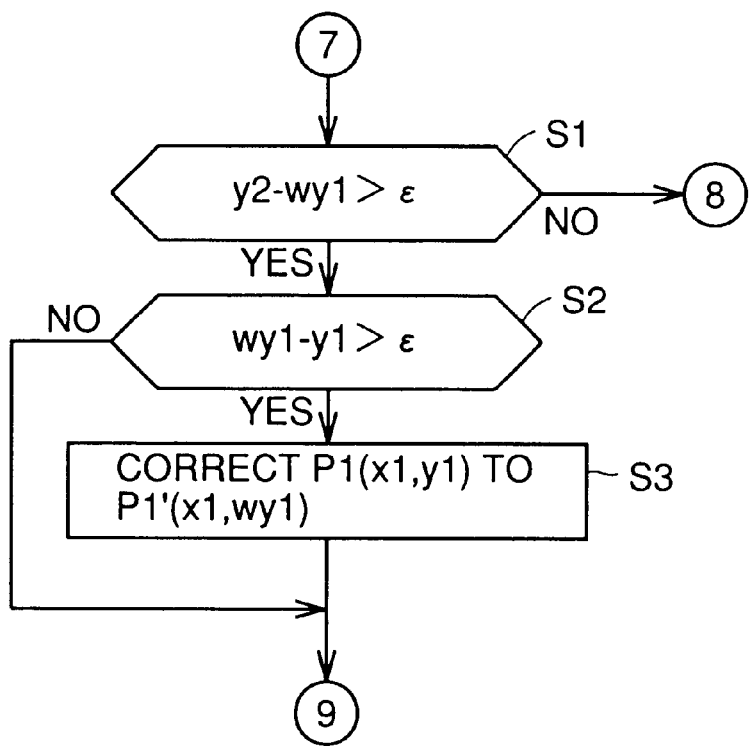
FIG. 47 is a flow chart showing boundary processing for the graphic area extending across the lower side of the graphic data processing area.
Figure 48:
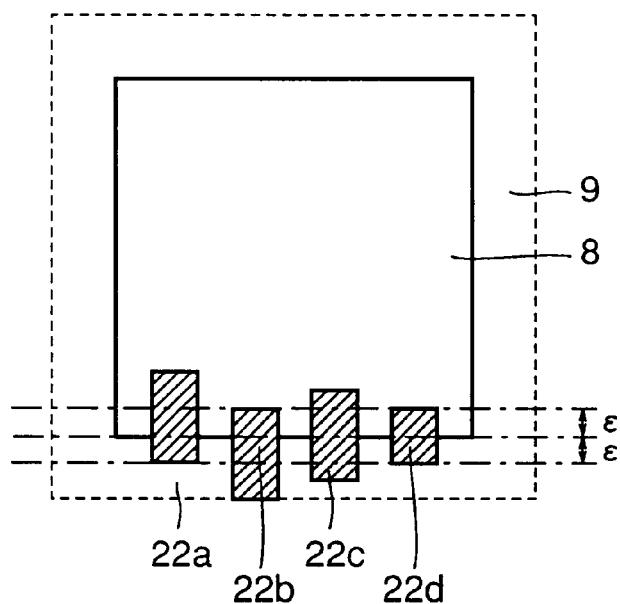
FIGS. 48 and 49 illustrate first and second steps of the boundary processing shown in FIG. 47 respectively.
Figure 49:
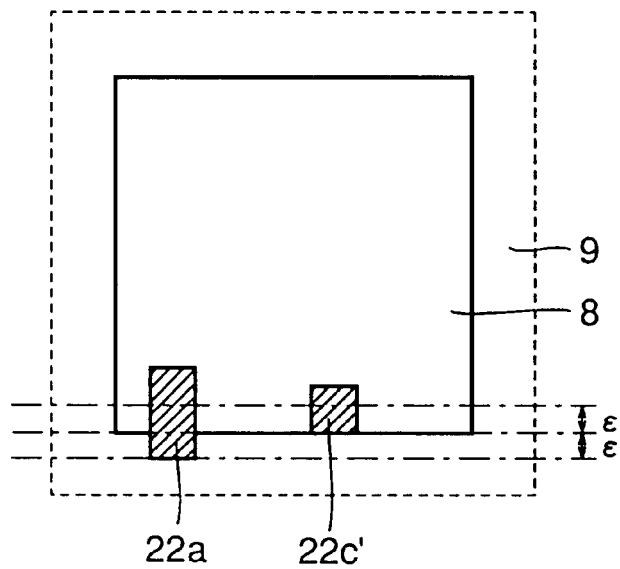
Figure 50A:
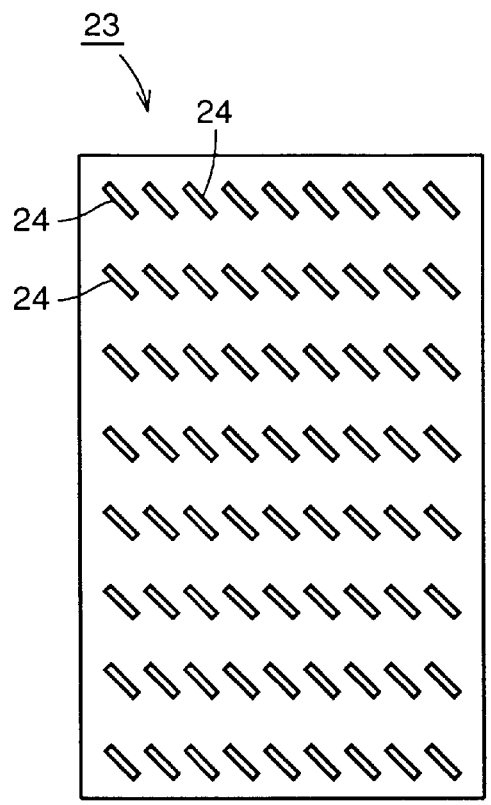
FIG. 50A illustrates exemplary conventional design layout data.
Figure 50B:
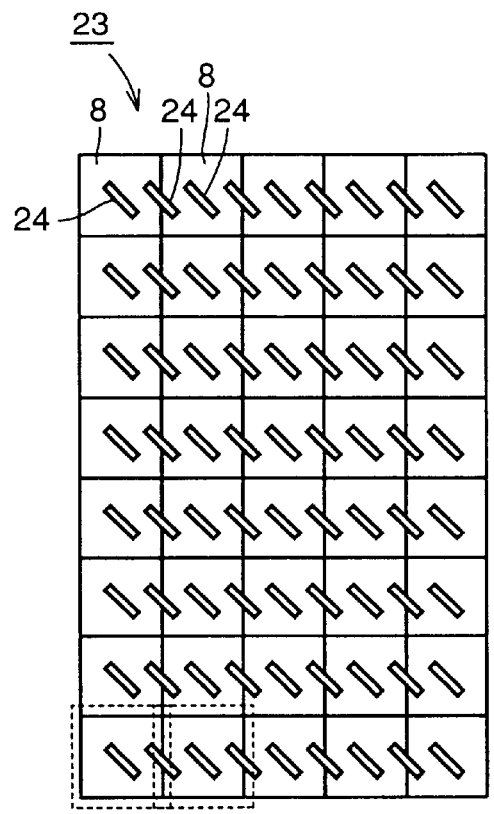
FIG. 50B illustrates the data of FIG. 50A split into graphic data processing areas.
Figure 50C:
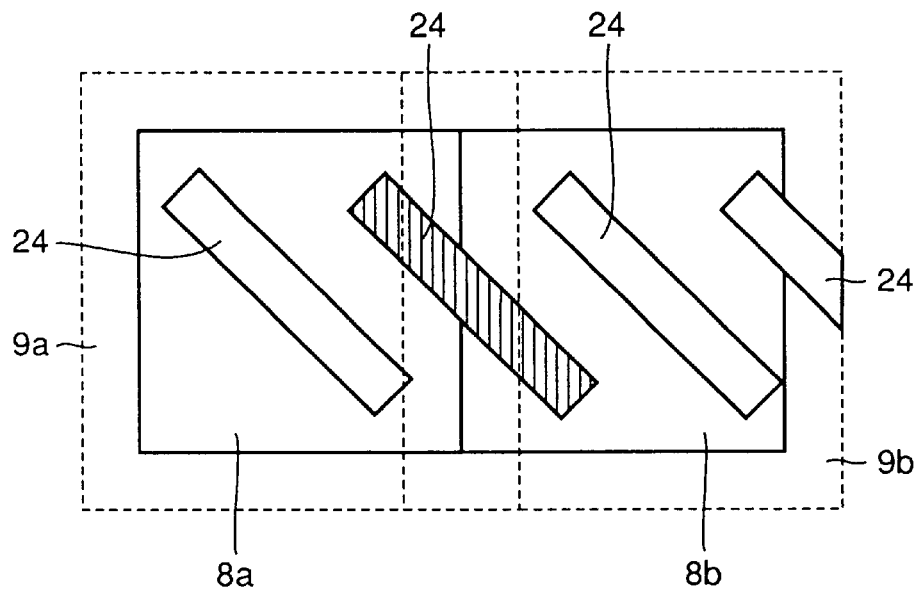
FIG. 50C illustrates a part of FIG. 50B in an enlarged manner.
Figure 53A:
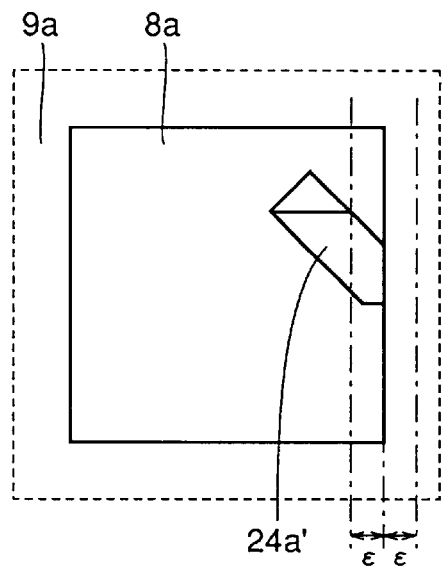
FIGS. 53A and 53B illustrate a third step of the data processing employing the conventional electron beam writing data creating device.
Figure 53B:
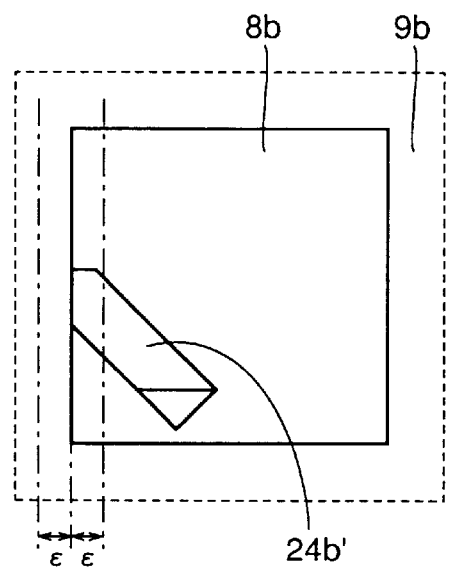
Figure 54A:
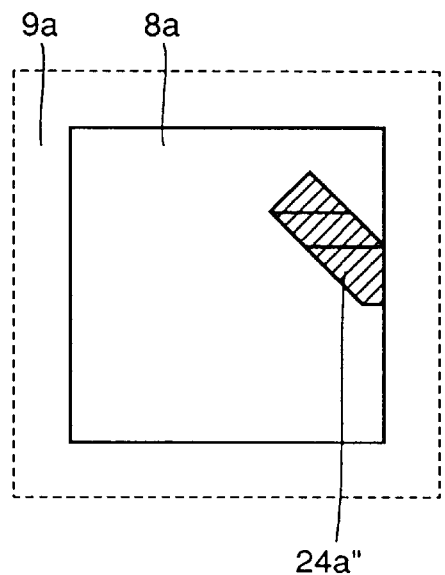
FIGS. 54A and 54B illustrate a fourth step of the data processing employing the conventional electron beam writing data creating device.
Figure 54B:
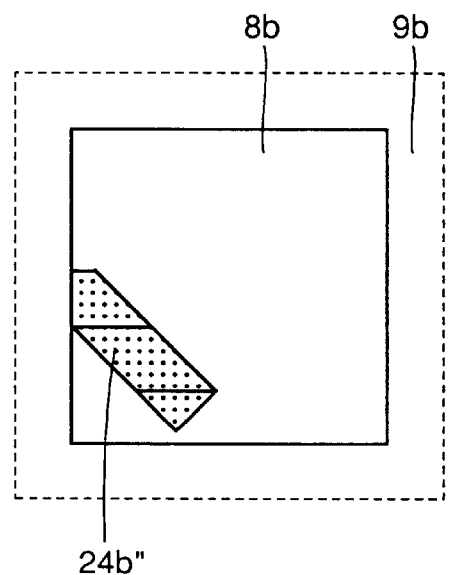

With reference to FIGS. 18 and 19, an embodiment 3 of the present invention is now described. FIG. 18 is a block diagram showing a characteristic structure of a electron beam writing data creating device according to the embodiment 3 of the present invention, and FIG. 19 is a flow chart of processing which is specific to the embodiment 3.

The embodiment 3, which is a modification of the aforementioned embodiment 2, is adapted to execute overlap removal processing on overall graphic data processing areas after redundant part removal processing.

In more concrete terms, the electron beam writing data creating device according to the embodiment 3 has a graphic repair means 12 similarly to the embodiment 2, while the structure of this graphic repair means 12 is different from that of the embodiment 2. According to the embodiment 3, the graphic repair means 12 comprises an unnecessary split line removal means 18 and a re-split means 19, as shown in FIG. 18.

With reference to FIG. 19, the characteristic processing of the electron beam writing data creating device according to the embodiment 3 is now described. Referring to FIG. 19, basic graphic data are inputted at a step S1, and graphic data processing areas are read at a step S2. Then, graphic data in the graphic data processing areas are read at a step S3, and the unnecessary split line removal means 18 removes unnecessary split lines for the graphic data in the graphic data processing areas and thereafter the re-split means 19 re-splits the graphic data from which the unnecessary split lines are removed into the basic graphics at a step S4. Thereafter the graphic data subjected to the aforementioned processing are outputted at a step S5. Thereafter a determination is made on presence/absence of unprocessed graphic data processing area at a step S6, and the processing is ended if the determination is of NO.

According to the embodiment 3, as hereinabove described, an effect substantially similar to that of the embodiment 2 can be attained due to the provision of the unnecessary split line removal means 18 and the re-split means 19 on the graphic repair means 12.

As hereinabove described, the electron beam writing data creating device according to the present invention has the redundant part split means, whereby the design layout data can be split into redundant parts and internal areas so that the overlap part removal processing can be performed in the respective areas independently of each other. Therefore, it is possible to effectively inhibit split lines, which are provided to the graphic data in the internal areas, from being provided to those in the redundant parts in the overlap removal processing in the internal areas. Thus, the graphic data in each redundant part can be recognized as the same shape as viewed from every adjacent graphic data processing area. Consequently, it is possible to effectively inhibit deficiency of the graphic data after the redundant part removal means removes overlap of the graphic data in the redundant parts. Thus, deterioration of dimensional accuracy of writing patterns can be effectively suppressed.

When the electron beam writing data creating device comprises the graphic repair means, the graphic data can be reconfigured with the basic graphics after the redundant part removal means removes overlapping portions of the graphic data in the redundant parts. Thus, small graphic data resulting from the redundant part split processing can be effectively suppressed.

When the graphic repair means comprises the graphic extract means, the contouring means and the contoured graphic split means, further, it is possible to split the contoured graphic data into basic graphics after the graphic data which are in contact with the outer peripheries of the redundant parts are extracted and the graphics are contoured. Thus, it is possible to effectively suppress generation of small graphic data which are in contact with the redundant part boundaries.

When the aforementioned graphic extract means has the function of selectively extracting only small graphic data and graphic data which are in contact with the small graphic data, the number of elements processed after extraction of the graphic data can be reduced. Thus, the processing can be further speeded up as compared with the aforementioned case.

When the graphic repair means comprises the unnecessary split line removal means and the re-split means, the unnecessary split line removal means can remove unnecessary split lines for the graphic data in the graphic data processing areas and the re-split means can re-split the graphic data from which the unnecessary split lines are removed into basic graphics after the redundant part removal means performs overlap removal processing of the graphic data in the redundant parts. Due to the aforementioned processing on the overall graphic data processing areas, generation of small graphic data on the redundant part boundaries can be effectively suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electron beam writing data creating device comprising:

graphic data processing area split means for splitting design layout data for forming a plurality of graphic data processing areas each having redundant areas so that adjacent said graphic data processing areas are in contact with each other and said redundant area of each said graphic data processing area overlaps with adjacent said graphic data processing area;

redundant part split means for splitting said design layout data into internal areas being defined in said graphic data processing areas by said outer peripheries of said redundant areas of said adjacent graphic data processing areas and redundant parts connecting all said redundant areas with each other;

overlap removal means for removing overlap of graphic data in said internal areas and said redundant parts independently of each other; and redundant part removal means for removing overlap of said graphic data in said redundant parts on boundaries between said graphic data processing areas.

2. The electron beam writing data creating device in accordance with claim 1, further comprising graphic repair means for reconfiguring said graphic data with basic graphics after said redundant part removal means removes said overlap of said graphic data in said redundant parts.

3. The electron beam writing data creating device in accordance with claim 2, wherein said graphic repair means includes:

graphic extract means for extracting graphic data being in contact with said outer peripheries of said redundant parts, contouring means for contouring said extracted graphic data, and contoured graphic split means for splitting said contoured graphic data into said basic graphics.

4. The electron beam writing data creating device in accordance with claim 3, wherein said graphic extract means has a function of selectively extracting only small graphic data and graphics being in contact with said small graphic data.

5. The electron beam writing data creating device in accordance with claim 2, wherein said graphic repair means includes:

unnecessary split line removal means for removing unnecessary split lines for said graphic data in said graphic data processing areas, and re-split means for re-splitting said graphic data into said basic graphics after said unnecessary split line removal means removes said unnecessary split lines.

6. A boundary processing method of oblique overlapping graphics to achieve dimensionally accurate electron beam irradiation comprising the steps of:

splitting design layout data for forming a plurality of graphic data processing areas each having redundant areas so that adjacent said graphic data processing areas are in contact with each other and said redundant area of each said graphic data processing area overlaps with adjacent said graphic data processing area;

splitting said design layout data into internal areas being defined in said graphic data processing areas by said outer peripheries of said redundant areas of said adjacent graphic data processing areas and redundant parts connecting all said redundant areas with each other;

removing overlap of graphic data in said internal areas and said redundant parts independently of each other; and removing overlap of said graphic data in said redundant parts on boundaries between said graphic data processing areas.

7. The boundary processing method of oblique overlapping graphics to achieve dimensionally accurate electron beam irradiation in accordance with claim 6, further comprising the step of reconfiguring said graphic data with basic graphics after removing said overlap of said graphic data in said redundant parts.

8. The boundary processing method of oblique overlapping graphics to achieve dimensionally accurate electron beam irradiation in accordance with claim 7, wherein said step of reconfiguring said graphic data includes the steps of:

extracting graphic data being in contact with said outer peripheries of said redundant parts, contouring said extracted graphic data, and splitting said contoured graphic data into said basic graphics.

9. The boundary processing method of oblique overlapping graphics to achieve dimensionally accurate electron beam irradiation in accordance with claim 8, wherein said step of extracting graphic data includes the step of selectively extracting only small graphic data and graphics being in contact with said small graphic data.

10. The boundary processing method of oblique overlapping graphics to achieve dimensionally accurate electron beam irradiation in accordance with claim 7, wherein said step of reconfiguring said graphic data includes the steps of:

removing unnecessary split lines for said graphic data in said graphic data processing areas, and re-splitting said graphic data into said basic graphics after removing said unnecessary split lines.

* * * * *